United States Patent
Shirakawa et al.

(10) Patent No.: US 12,254,929 B2
(45) Date of Patent: *Mar. 18, 2025

(54) SEMICONDUCTOR MEMORY DEVICE

(71) Applicant: Kioxia Corporation, Tokyo (JP)

(72) Inventors: Masanobu Shirakawa, Chigasaki Kanagawa (JP); Takuya Futatsuyama, Yokohama Kanagawa (JP); Kenichi Abe, Yokohama Kanagawa (JP); Hiroshi Nakamura, Fujisawa Kanagawa (JP); Keisuke Yonehama, Kamakura Kanagawa (JP); Atsuhiro Sato, Meguro Tokyo (JP); Hiroshi Shinohara, Yokosuka Kanawaga (JP); Yasuyuki Baba, Ayase Kanagawa (JP); Toshifumi Minami, Yokohama Kanagawa (JP)

(73) Assignee: Kioxia Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/326,587

(22) Filed: May 31, 2023

(65) Prior Publication Data

US 2023/0317173 A1     Oct. 5, 2023

Related U.S. Application Data

(63) Continuation of application No. 17/585,370, filed on Jan. 26, 2022, now Pat. No. 11,705,204, which is a
(Continued)

(30) Foreign Application Priority Data

Mar. 14, 2014   (JP) ................................. 2014-052746

(51) Int. Cl.
*G11C 16/00* (2006.01)
*G11C 11/56* (2006.01)
(Continued)

(52) U.S. Cl.
CPC .......... *G11C 16/14* (2013.01); *G11C 11/5635* (2013.01); *G11C 16/0483* (2013.01);
(Continued)

(58) Field of Classification Search
CPC ..... G11C 16/0483; G11C 16/10; G11C 16/08; G11C 16/26; G11C 16/14; G11C 16/3445;
(Continued)

(56) References Cited

U.S. PATENT DOCUMENTS 7,200,708 B1   4/2007  Kreifels
7,274,596 B2   9/2007  Roohparvar
(Continued)

FOREIGN PATENT DOCUMENTS

JP   2011066110 A   3/2011
JP   2012169027 A   9/2012
(Continued)

OTHER PUBLICATIONS

Chinese Office Action dated Apr. 4, 2018 in related Chinese Patent Application No. 201410453781.X (6 pages).
(Continued)

*Primary Examiner* — Thong Q Le
(74) *Attorney, Agent, or Firm* — Kim & Stewart LLP

(57) ABSTRACT

A semiconductor memory device includes a first memory cell, a second memory cell above the first memory cell, a first word line electrically connected to a gate of the first memory cell, a second word line electrically connected to a gate of the second memory cell, and a control unit that performs an erasing operation on the first and second memory cells. During the erasing operation, the control unit applies a first voltage to a first word line and a second voltage higher than the first voltage to a second word line.

16 Claims, 27 Drawing Sheets

Related U.S. Application Data continuation of application No. 17/103,504, filed on Nov. 24, 2020, now Pat. No. 11,270,773, which is a continuation of application No. 16/459,495, filed on Jul. 1, 2019, now Pat. No. 10,854,298, which is a continuation of application No. 16/056,835, filed on Aug. 7, 2018, now Pat. No. 10,381,084, which is a continuation of application No. 15/791,178, filed on Oct. 23, 2017, now Pat. No. 10,074,434, which is a continuation of application No. 15/174,849, filed on Jun. 6, 2016, now Pat. No. 9,799,403, which is a continuation of application No. 14/469,522, filed on Aug. 26, 2014, now Pat. No. 9,361,988.

(51) Int. Cl.

| | | |
|---|---|---|
| *G11C 16/04* | (2006.01) | |
| *G11C 16/08* | (2006.01) | |
| *G11C 16/10* | (2006.01) | |
| *G11C 16/14* | (2006.01) | |
| *G11C 16/26* | (2006.01) | |
| *G11C 29/42* | (2006.01) | |
| *H10B 43/27* | (2023.01) | |
| *H10B 43/35* | (2023.01) | |
| *G11C 16/34* | (2006.01) | |

(52) U.S. Cl.
CPC ............ *G11C 16/08* (2013.01); *G11C 16/10* (2013.01); *G11C 16/26* (2013.01); *G11C 29/42* (2013.01); *H10B 43/27* (2023.02); *H10B 43/35* (2023.02); *G11C 16/3445* (2013.01)

(58) Field of Classification Search
CPC . G11C 29/42; G11C 11/5635; G11C 11/5628; G11C 16/16; G11C 16/3459; G11C 11/5642; G11C 16/32; G11C 16/0466; G11C 2211/5621; G11C 16/30; G11C 16/3481; G11C 16/0408; G11C 16/3418; G11C 7/1006; G11C 11/5671; G11C 16/349; G11C 2211/5648; G11C 29/52; G11C 16/0433; G11C 16/24; G11C 16/3404; G11C 16/3427; G11C 29/028; G11C 16/3409; G11C 2029/0409; G11C 7/04; G11C 8/08; G11C 11/5621; G11C 16/28; G11C 16/34; G11C 16/3431; G11C 16/3477; G11C 2211/5646; G11C 29/021; G11C 29/025; G11C 29/44; G11C 16/102; G11C 2029/0411; G11C 2029/1206; G11C 5/143; G11C 7/18; G11C 8/14

See application file for complete search history.

(56) References Cited

U.S. PATENT DOCUMENTS

| | | |
|---|---|---|
| 8,817,538 B2 | 8/2014 | Itagaki et al. |
| 10,381,084 B2 | 8/2019 | Shirakawa |
| 2003/0235080 A1 | 12/2003 | Yaegashi et al. |
| 2009/0303790 A1 | 12/2009 | Fujimura et al. |
| 2011/0018052 A1 | 1/2011 | Fujiwara et al. |
| 2011/0103149 A1 | 5/2011 | Katsumata et al. |
| 2011/0199833 A1 | 8/2011 | Shim et al. |
| 2011/0216604 A1 | 9/2011 | Mikajiri et al. |
| 2012/0026775 A1 | 2/2012 | Yamada et al. |
| 2012/0243309 A1 | 9/2012 | Asaoka et al. |
| 2012/0287710 A1 | 11/2012 | Shirakawa |
| 2012/0320698 A1 | 12/2012 | Itagaki et al. |
| 2013/0094295 A1 | 4/2013 | Bartoli et al. |
| 2013/0182521 A1 | 7/2013 | Jang |
| 2013/0242667 A1 | 9/2013 | Shim et al. |
| 2015/0155047 A1 | 6/2015 | Kim |
| 2022/0148657 A1* | 5/2022 | Shirakawa ............ H10B 43/35 |

FOREIGN PATENT DOCUMENTS

| | | |
|---|---|---|
| JP | 2012203969 A | 10/2012 |
| JP | 2014013634 A | 1/2014 |

OTHER PUBLICATIONS

Japanese Office Action dated Dec. 6, 2016 in related Japanese Patent Application 2014-052746 with English Translation (11 pages).
Taiwanese Office Action dated Mar. 16, 2017 in related Taiwanese Patent Application 105113130 with English Translation (7 pages).

* cited by examiner

SEMICONDUCTOR MEMORY DEVICE

CROSS-REFERENCE TO RELATED APPLICATION

This application is a continuation of U.S. patent application Ser. No. 17/585,370, filed Jan. 26, 2022, which is a continuation of U.S. patent application Ser. No. 17/103,504, filed Nov. 24, 2020, now U.S. Pat. No. 11,270,773, issued Mar. 8, 2022, which is a continuation of U.S. patent application Ser. No. 16/459,495, filed Jul. 1, 2019, now U.S. Pat. No. 10,854,298, issued Dec. 1, 2020, which is a continuation of U.S. patent application Ser. No. 16/056,835, filed Aug. 7, 2018, now U.S. Pat. No. 10,381,084, issued Aug. 13, 2019, which is a continuation of U.S. patent application Ser. No. 15/791,178, filed Oct. 23, 2017, now U.S. Pat. No. 10,074,434, issued Sep. 11, 2018, which is a continuation of U.S. patent application Ser. No. 15/174,849, filed Jun. 6, 2016, now U.S. Pat. No. 9,799,403, issued Oct. 24, 2017, which is a continuation of U.S. patent application Ser. No. 14/469,522, filed Aug. 26, 2014, now U.S. Pat. No. 9,361,988, issued Jun. 7, 2016, which is based upon and claims the benefit of priority from Japanese Patent Application No. 2014-052746, filed Mar. 14, 2014, the entire contents of which are incorporated herein by reference.

FIELD

Embodiments described herein relate generally to a semiconductor memory device.

BACKGROUND

A NAND flash memory in which memory cells are three-dimensionally arrayed is known.

BRIEF DESCRIPTION OF THE DRAWINGS

FIG. 8B shows a cross section taken along line A-A, a cross section taken along line B-B, a cross section taken along line C-C, a cross section taken along line D-D, a cross section taken along line E-E, and a cross section taken along line F-F, in FIG. 4.

DETAILED DESCRIPTION

Figure 1:
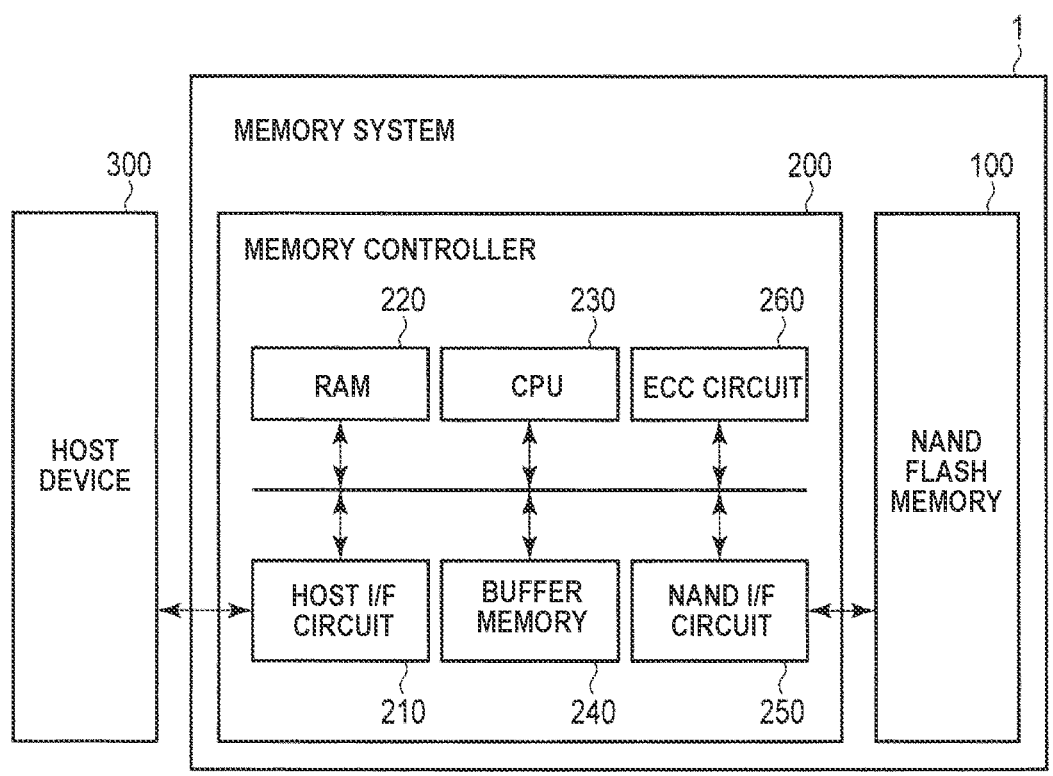
FIG. 1 is a block diagram of a memory system according to a first embodiment.

The present embodiment now will be described more fully hereinafter with reference to the accompanying drawings, in which various embodiments are illustrated. In the drawings, the thickness of layers and regions may be exaggerated for clarity. Like numbers refer to like elements throughout. As used herein the term "and/or" includes any and all combinations of one or more of the associated listed items and may be abbreviated as "/".

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "having," "includes," "including" and/or variations thereof, when used in this specification, specify the presence of stated features, regions, steps, operations, elements, and/or components, but do not preclude the presence or addition of one or more other features, regions, steps, operations, elements, components, and/or groups thereof.

It will be understood that when an element such as a layer or region is referred to as being "on" or extending "onto" another element (and/or variations thereof), it may be directly on or extend directly onto the other element or intervening elements may also be present. In contrast, when an element is referred to as being "directly on" or extending "directly onto" another element (and/or variations thereof), there are no intervening elements present. It will also be understood that when an element is referred to as being "connected" or "coupled" to another element (and/or variations thereof), it may be directly connected or coupled to the other element or intervening elements may be present. In contrast, when an element is referred to as being "directly connected" or "directly coupled" to another element (and/or variations thereof), there are no intervening elements present.

It will be understood that, although the terms first, second, etc. may be used herein to describe various elements, components, regions, layers and/or sections, these elements, materials, regions, layers and/or sections should not be limited by these terms. These terms are only used to distinguish one element, material, region, layer or section from another element, material, region, layer or section. Thus, a first element, material, region, layer or section discussed below could be termed a second element, material, region, layer or section without departing from the teachings of the present invention.

Relative terms, such as "lower", "back", and "upper" may be used herein to describe one element's relationship to another element as illustrated in the Figures. It will be understood that relative terms are intended to encompass different orientations of the device in addition to the orientation depicted in the Figures. For example, if the structure in the Figure is turned over, elements described as being on the "backside" of substrate would then be oriented on "upper" surface of the substrate. The exemplary term "upper", may therefore, encompass both an orientation of "lower" and "upper," depending on the particular orientation of the figure. Similarly, if the structure in one of the figures is turned over, elements described as "below" or "beneath" other elements would then be oriented "above" the other elements. The exemplary terms "below" or "beneath" may, therefore, encompass both an orientation of above and below.

Embodiments are described herein with reference to cross sections and perspective illustrations that are schematic illustrations of embodiments. As such, variations from the shapes of the illustrations as a result, for example, of manufacturing techniques and/or tolerances, are to be expected. Thus, embodiments should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated, typically, may be rounded. Thus, the regions illustrated in the figures are schematic in nature and their shapes are not intended to illustrate the precise shape of a region and are not intended to limit the scope of the present invention.

Provided is a semiconductor memory device that may improve operational reliability.

In general, according to one embodiment, a semiconductor memory device includes a first memory cell, a second memory cell stacked above the first memory cell, a first word line electrically connected to a gate of the first memory cell, a second word line electrically connected to a gate of the second memory cell, and a control unit that performs an erasing operation on the first and second memory cells. During the erasing operation, the control unit applies a first voltage to the first word line and a second voltage higher than the first voltage to the second word line.

Hereinafter, embodiments configured below will be described with reference to the drawings. In the following description, for components having substantially the same function and configuration are given of the same reference numerals and the description will only be repeated, if necessary.

It should be noted that the drawings are schematic and the relationship between the thickness and the plane dimension, the ratio of the thickness of each of layers, or the like are different from reality. Accordingly, specific thickness or dimension, if any, should be determined with reference to the following description. In addition, it is natural that a portion, in which the dimensional relationship or the ratio is different from each other, is included even between the drawings.

First Embodiment

A semiconductor memory device according to a first embodiment will be described. Hereinafter, the semiconductor memory device will be described with reference to an example of a three-dimensional stacked NAND flash memory with memory cell transistors stacked above a semiconductor substrate.

Regarding Configuration of Memory System

First, the configuration of a memory system including the semiconductor memory device according to the present embodiment will be described with reference to FIG. 1.

As illustrated in FIG. 1, a memory system 1 includes a NAND flash memory 100 and a memory controller 200. The memory controller 200 and the NAND flash memory 100 may be combined with each other to form a single semiconductor device. Examples thereof include a memory card such as SD™ card, a solid state drive (SSD), or the like.

The NAND flash memory 100 includes a plurality of memory cell transistors (simply referred to as memory cells or the like) and stores data in a nonvolatile manner. The configuration of the NAND flash memory 100 will be described in detail.

The memory controller 200 gives instructions such as "read data from the NAND flash memory 100", "write data to the NAND flash memory 100", "erase data from the NAND flash memory 100", and the like in response to an instruction from outside host device 300. In addition, the memory controller 200 manages memory space of the NAND flash memory 100.

The memory controller 200 includes a host interface circuit 210, a built-in memory (RAM) 220, a processor (CPU) 230, a buffer memory 240, a NAND interface circuit 250, and an ECC circuit 260.

The host interface circuit 210 is connected to the host device 300 via a controller bus and conducts communication with the host device 300. The host interface circuit 210 transmits instructions and data received from the host device 300 to the CPU 230 and the buffer memory 240, respectively. In addition, the host interface circuit 210 transmits data within the buffer memory 240 to the host device 300 in response to an instruction of the CPU 230.

The NAND interface circuit 250 is connected to the NAND flash memory 100 via a NAND bus and conducts communication with the NAND flash memory 100. The NAND interface circuit 250 transmits an instruction received from the CPU 230 to the NAND flash memory 100. In addition, during writing, the NAND interface circuit 250 transmits write data in the buffer memory 240 to the NAND flash memory 100. Furthermore, during reading, the NAND interface circuit 250 transmits data which is read from the NAND flash memory 100 to the buffer memory 240.

The CPU 230 controls the overall operation of the memory controller 200. For example, when the CPU 230 receives a writing instruction from the host device 300, the CPU 230 issues a writing instruction based on the NAND interface circuit 250 in response to the writing instruction received from the host device 300. The similar operation is performed during reading and erasing. In addition, the CPU 230 performs various processings for managing the NAND flash memory 100 such as wear leveling. Furthermore, the CPU 230 performs various arithmetic operations. For example, the CPU 230 performs encryption processing of data, randomizing processing, or the like.

The ECC circuit 260 performs error checking and correcting (ECC) of data. That is, the ECC circuit 260 generates a parity based on the write data during writing data, detects errors by generating a syndrome from the parity during reading data, and corrects the errors. The CPU 230 may also have the function of the ECC circuit 260.

The built-in memory 220 is a semiconductor memory such as DRAM and is used as a work area of the CPU 230. The built-in memory 220 holds firmware for managing the NAND flash memory 100, various management tables, or the like.

Regarding Configuration of Semiconductor Memory Device

Next, the configuration of the semiconductor memory device 100 according to the first embodiment will be described with reference to FIG. 2.

Figure 2:
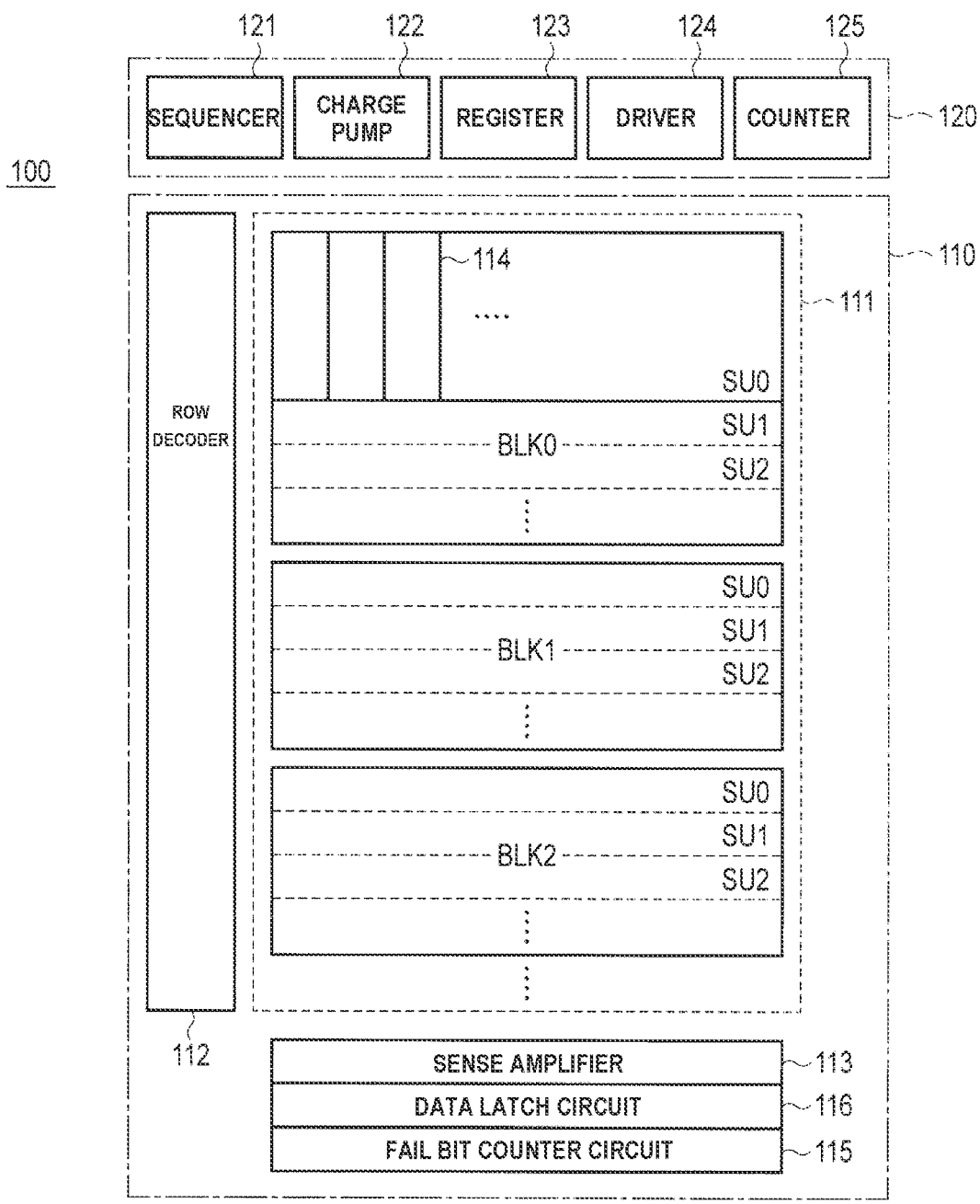
FIG. 2 is a block diagram of a semiconductor memory device according to the first embodiment.

The NAND flash memory 100 includes a core portion 110 and a peripheral circuit 120 as illustrated in FIG. 2.

The core portion 110 includes a memory cell array 111, a row decoder 112, a sense amplifier 113, a fail bit counter circuit 115, and a data latch circuit 116.

The memory cell array 111 includes a plurality (three in the example of FIG. 2) of blocks BLK (BLK0, BLK1, BLK2, . . . ), each of which is a collection of a plurality of nonvolatile memory cell transistors associated with word lines and a bit line. The blocks BLK include a plurality of memory cell transistors that share word lines WL. For example, data within the same block BLK are erased collectively. Each of the blocks BLK includes a plurality of string units SU (SU0, SU1, SU2, . . . ) which is a set of NAND strings 114 to which the memory cell transistors are connected in series. The number of blocks within the memory cell array 111 and the number of string units within one block BLK are arbitrary. In the semiconductor memory device 100, the erasure unit is not limited to the block BLK. For example, only a plurality of strings may be set as the erasure unit and the string units may be set as the erasure unit.

The row decoder 112 decodes a block address or a page address to make a corresponding block be in a selection state. The row decoder 112 applies an adequate voltage to select gates of selected string units and non-selected string units, and selected word lines and non-select word lines, in accordance with the page address which is selected in a selected block.

The sense amplifier 113 senses or amplifies data read on a bit line from the memory cell transistors during reading of the data. In addition, the sense amplifier 113 transmits write data to the memory cell transistors during writing of the data. The reading and the writing of the data with respect to the memory cell array 111 is performed by a plurality of units of memory cell transistors and the unit of operation is a page.

The data latch circuit 116 stores a verification result which is detected by the sense amplifier 113.

The fail bit counter circuit 115 counts the number of bits, for which a program operation has not completed successfully, from the verification result stored in the data latch circuit 116. The fail bit counter circuit 115 determines whether the program operation passes or fails by comparing the number of bits, for which the program operation has not completed successfully, and the allowed number of failed bits, to inform the determined information to a sequencer 121.

The peripheral circuit 120 includes the sequencer 121, a charge pump 122, a register 123, a driver 124, and a counter 125.

The driver 124 supplies a voltage required for the reading, the writing, the erasing of the data to the row decoder 112, sense amplifier 113, fail bit counter circuit 115, a source line driver (not illustrated), and the like. The voltage is applied to the memory cell transistors (word lines, select gate lines, back gate lines, bit lines, and source lines which will be described below) through the row decoder 112, the sense amplifier 113, and the source line driver.

The charge pump 122 supplies the required voltage to the driver 124 by boosting a supply voltage applied from the outside.

The register 123 holds various signals. For example, the register 123 holds a status of the operation of writing or erasing data, and as a result, notifies whether or not the operation has successfully completed to the controller. Alternatively, the register 123 may also hold various tables.

The counter 125 is a register that counts and holds the number of times (loop frequency) the voltage is applied during the erasing.

The sequencer 121 is a control unit that controls the overall operation of the NAND flash memory 100.

Regarding Memory Cell Array

Next, the configuration of the memory cell array 111 according to the first embodiment will be described in detail using FIGS. 3 and 4.

Figure 3:
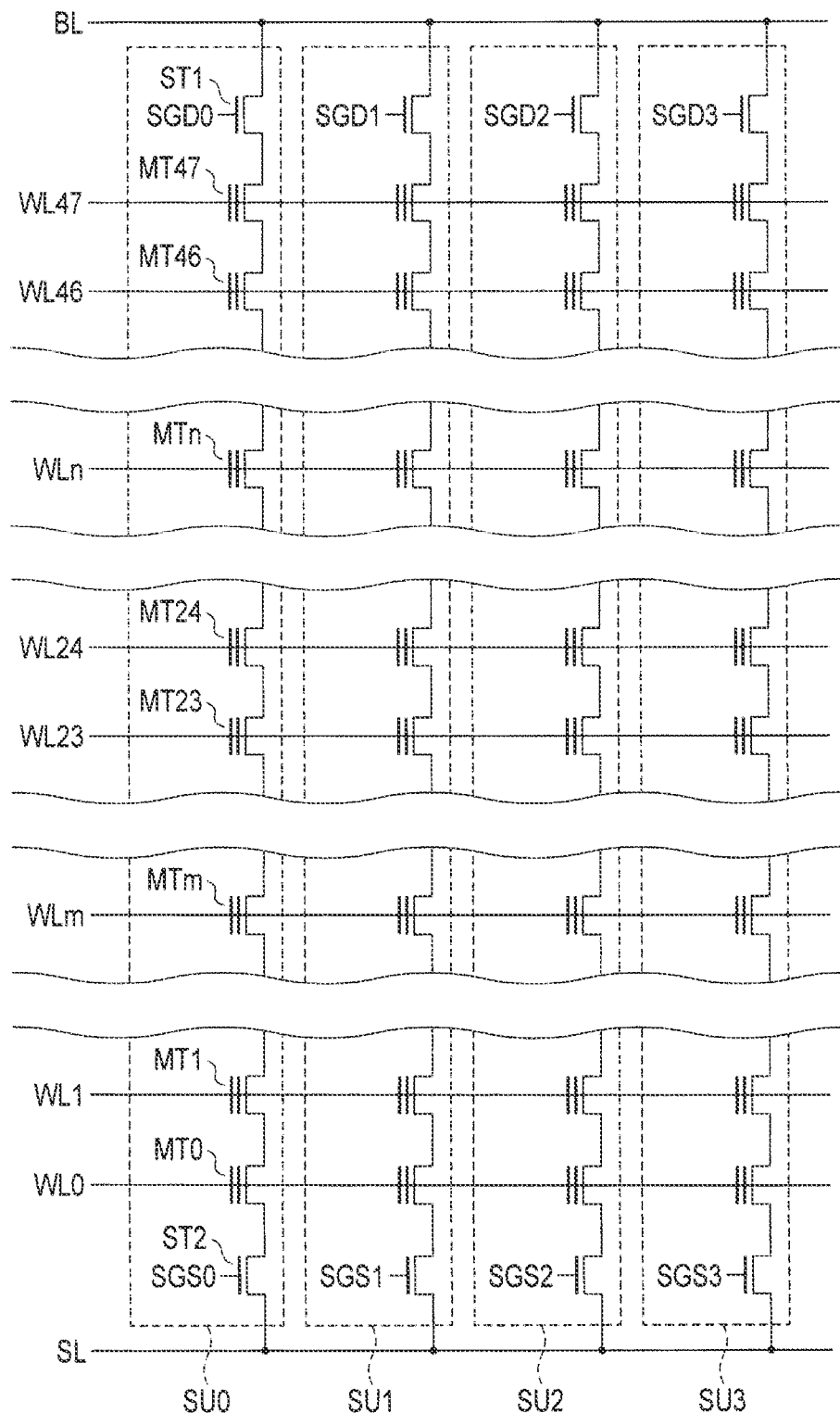
FIG. 3 is a circuit diagram of a memory cell array according to the first embodiment.

The block BLK0 has a plurality of columns in a direction perpendicular to the paper surface as illustrated in FIG. 3. In addition, as illustrated in FIG. 3, the block BLK0 includes, for example, four string units SU (SU0 to SU3). In addition, each of the string units SU includes a plurality of NAND strings 114 (see FIG. 2). Other blocks BLK also have the same configuration as that of the block BLK0.

Each of the NAND strings 114 includes, for example, 48 memory cell transistors MT (MT0 to MT47) and select transistors ST1 and ST2. The memory cell transistor MT includes a stacked gate containing a control gate and a charge storage layer, and holds the data in a nonvolatile state. The number of the memory cell transistors MT is not limited to 48. The number of the memory cell transistors MT may be 8, 16, 32, 64, 128, or the like. There is no specific restriction on the number the memory cell transistors MT. In addition, the memory cell transistors are simply referred to as memory cell transistors MT when a particular memory cell transistor is not referenced.

The memory cell transistors MT are disposed between the select transistors ST1 and ST2, with its current path connected in series. The current path of the memory cell transistor MT47 on one end side of the serial connection is connected to an end of the current path of the select transistor ST1, and the current path of the memory cell transistor MT0 on the other end side is connected to an end of the current path of the select transistor ST2.

The gates of the select transistors ST1 of the string units SU0 to SU3 are respectively connected to the select gate lines SGD0 to SGD3. The gates of the select transistors ST2 are respectively connected to the select gate lines SGS0 to SGS3. In contrast to the above, the respective control gates of the memory cell transistors MT0 to MT47 in the same block BLK0 are commonly connected to the word lines WL0 to WL47. The word lines are simply referred to as word lines WL when a particular word line is not referenced.

That is, the word lines WL0 to WL47 are commonly connected between the plural string units SU0 to SU3 in the same block BLK0. The select gate lines SGD and SGS are set independent in each of the string units SU0 to SU3 even in the same block BLK0.

In addition, among the NAND strings 114 arranged in a matrix shape in the memory cell array 111, the other ends of the current paths of the select transistors ST1 of the NAND strings 114 in the same row are commonly connected to certain one of bit lines BL (BL0 to BL (L−1), where (L−1) represents a natural number of 1 or greater). That is, the bit line BL is commonly connected to the NAND strings 114 between plural blocks BLK. The other end of the current path of the select transistor ST2 is commonly connected to the source lines SL. The source lines SL are commonly connected to the NAND strings 114 between plural blocks, for example.

As described above, the data of the memory cell transistors MT in the same block BLK may be erased collectively. In contrast to the above, the reading and the writing of the data are carried out collectively for the plural memory cell transistors MT which are commonly connected to a certain word line WL in a certain string unit SU of a certain block BLK. The unit of reading and writing is called a "page".

Next, a configuration example of the memory cell array 111 will be described in detail with reference to FIG. 4. The structure illustrated in FIG. 4 is arranged in the depth direction (D2 direction) of the page, on which FIG. 4 is drawn, in plural, and the structures share the word lines WL and the select gate lines SGD and SGS to form a string unit SU.

A peripheral circuit such as the sense amplifier 113 may be formed on the semiconductor substrate (not illustrated) and the memory cell array 111 may be formed on the peripheral circuit. A source line SL31 is formed above the semiconductor substrate.

Figure 4:
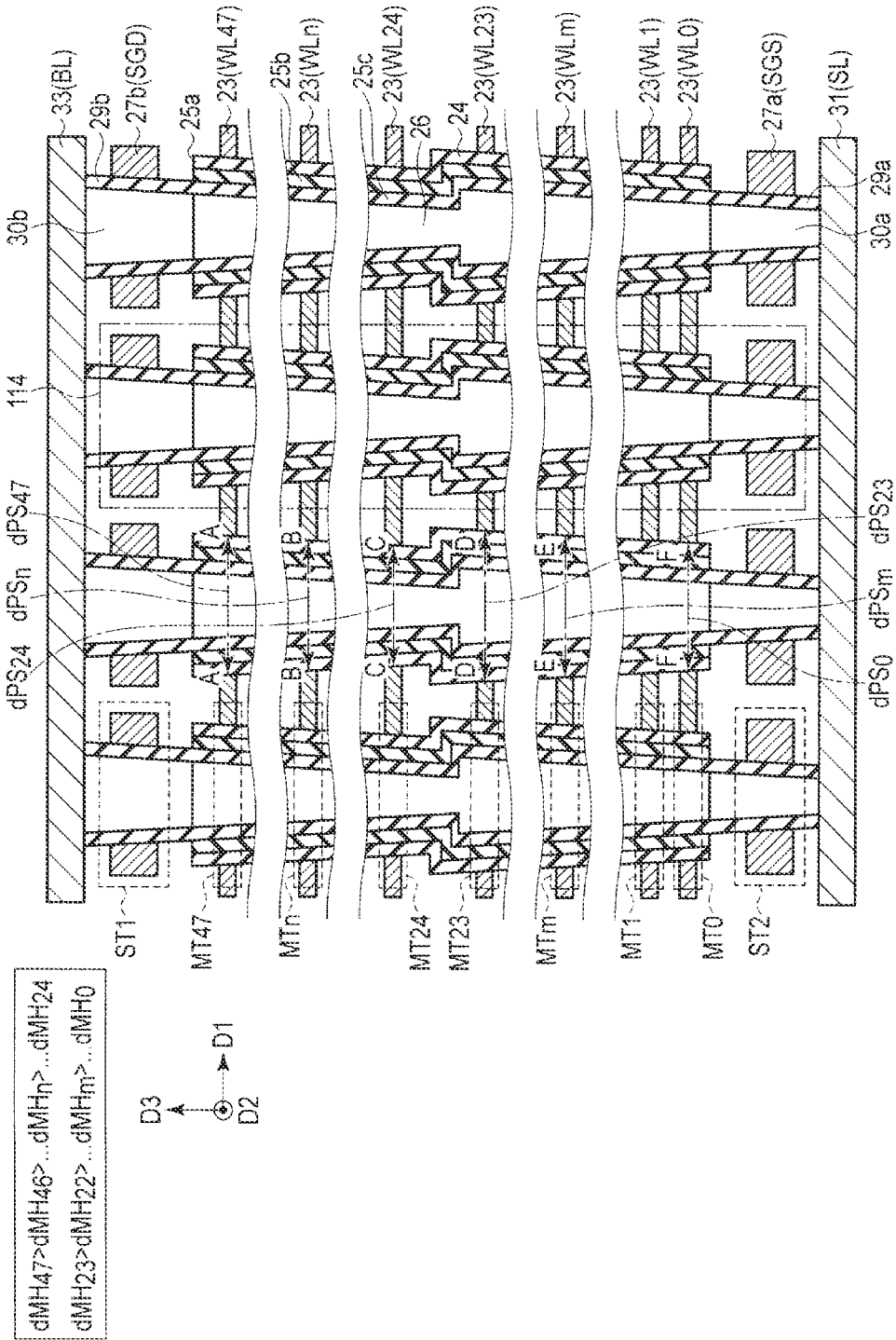
FIG. 4 is a cross-sectional view of the memory cell array according to the first embodiment.

As illustrated in FIG. 4, an electroconductive film 27a (for example, polycrystalline silicon films) which functions as the select gate line SGS is formed above the source line SL31. In addition, a plurality of electroconductive films (for example, polycrystalline silicon films) 23 which function as the word lines WL are formed on the electroconductive film 27a. Furthermore, an electroconductive film (for example, polycrystalline silicon film) 27b which functions as the select gate line SGD is formed on the electroconductive films 23. Interelectrode insulating films are formed between each of the electroconductive films 23, 27a, 27b so as to electrically separate each of the electroconductive films 23, 27a, 27b in the D3 direction. More specifically, the electroconductive films 23 and the interelectrode insulating films are alternately stacked in the D3 direction.

Memory holes, which are extended in the vertical direction (D3 direction: direction orthogonal to the D2 direction) with respect to the surface of the semiconductor substrate, are formed within the above-described electroconductive films 23, 27a, 27b, and interelectrode insulating films. In the present embodiment, the diameter of the memory holes in a parallel plane in the D1 direction (direction orthogonal to the D2 direction and the D3 direction), and D2 direction is referred to as an MH diameter. In the present embodiment, the memory holes are formed in a multilayered film which is a stacked structure of the electroconductive films 23, 27a, 27b, interelectrode insulating films, and the like. In this case, the upper layer area in the multilayered film is more etched compared to the lower layer area. The MH diameters of the memory holes in the upper layer area are larger than the MH diameters of the memory holes in the lower layer area. The difference between the MH diameters become larger as the etching distance (D3 direction) of the memory hole becomes longer. In the first embodiment, the memory holes formed in the above-described electroconductive films 23 are formed by being divided into two stages, for example. More specifically, first memory holes are formed in the electroconductive films 23 as the word lines WL0 to WL23, and then, second memory holes are formed in the electroconductive films 23 as the word lines WL24 to WL47.

A block insulating film 25a, a charge storage layer 25b, a gate insulating film 25c, and a semiconductor layer 26 are sequentially formed on the inner wall of the first and the second memory holes, the inner wall being formed in a columnar structure. The semiconductor layer 26 functions as a current path of the NAND string 114, and is an area in which a channel is formed during the operation of the memory cell transistors MT.

In the present disclosure, the diameter of the columnar structure embedded in the memory hole in the plane parallel to the D1 direction (which is a direction orthogonal to the D2 direction and the D3 direction) and the D2 direction is referred to as PS diameter. In addition, the length of the PS diameter is expressed as dPS or the like.

Here, the PS diameter in the memory cell transistor MT0 is $dPS_0$, the PS diameter in the memory cell transistor MTm (m is an integer from 1 to smaller than 23) is $dPS_m$, ($dPS_0 < dPS_m$), and the PS diameter in the memory cell transistor MT23 is $dPS_{23}$, ($dPS_0 < dPS_m < dPS_{23}$). That is, the PS diameter of the memory cell transistor MT sequentially becomes larger from the memory cell transistor MT0 to the memory cell transistor MT23 ($dPS_i < dPS_j$ (i<j); and i and j are integers from 0 to 23). In addition, the PS diameter in the memory cell transistor MT24 is $dPS_{24}$, the PS diameter in the memory cell transistor MTn (n is an integer from 25 to smaller than 47) is $dPS_n$, ($dPS_{24} < dPS_n$), and the PS diameter in the memory cell transistor MT47 is $dPS_{47}$, ($dPS_{24} < dPS_n < dPS_{47}$). That is, the PS diameter of the memory cell transistor MT sequentially becomes larger from the MT24 to the MT47 ($dPS_y < dPS_z$ (y<z); and y and z are integers from 24 to 47). In addition, in the present embodiment, the $dPS_{23}$ as the PS diameter of the memory cell transistor MT23 is larger than the $dPS_{24}$ as the PS diameter of the memory cell transistor MT24.

In the present embodiment, for simplification, the memory cell transistors MT0 and MT24 are shown to have the same PS diameter, the memory cell transistors MTm and MTn are shown to have the same PS diameter, and the memory cell transistors MT23 and MT47 are shown to have the same PS diameter. However, it is not necessary that embodiments are limited to the configuration. For example, the memory cell transistors MT0 and MT24 may not have the same PS diameter.

Furthermore, an electroconductive film 30b is formed on the electroconductive film 26 and a bit line layer 33 is formed on the electroconductive film 30b.

Regarding Threshold Value Distribution of Memory Cell Transistors

Figure 5:
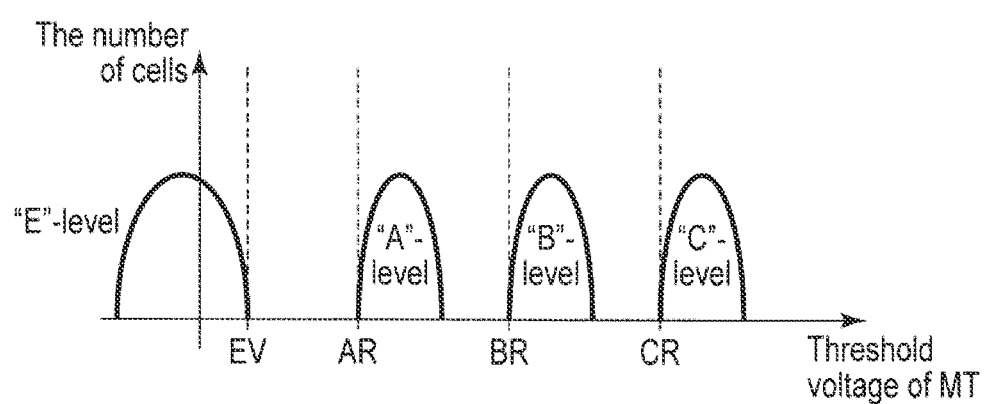
FIG. 5 is a graph illustrating a threshold value distribution of memory cell transistors according to the first embodiment.

Next, a threshold value distribution of the memory cell transistors according to the present embodiment will be described with reference to FIG. 5. As illustrated in FIG. 5, the memory cell transistors MT may hold 2-bit data according to the threshold value of the memory cell transistors, for example. The 2-bit data are, for example, an "E" level, an "A" level, a "B" level, and a "C" level in the ascending order of the threshold value.

The "E" level is a threshold value in a state where the data is erased. For example, the "E" level has a negative value (or may have a positive value), and is lower than an erasing verification level (also referred to as a verification level, a verification voltage, or the like) EV. The "A" to "C" levels are threshold values in a state where charge is injected into the charge storage layer. "A" level is a threshold value, which is higher than a reading level "AR" and is lower than a reading level "BR". The "B" level is a threshold value, which is higher than the reading level "BR" and is lower than a reading level "CR". The "C" level is a threshold value which is higher than the reading level "CR.

Each memory cell transistor MT may store the 2-bit data (4-level data) by taking the four threshold value levels.

Regarding Zones

Next, zones used during a verification operation of the memory system 1 according to the present embodiment will be described.

Figure 6:
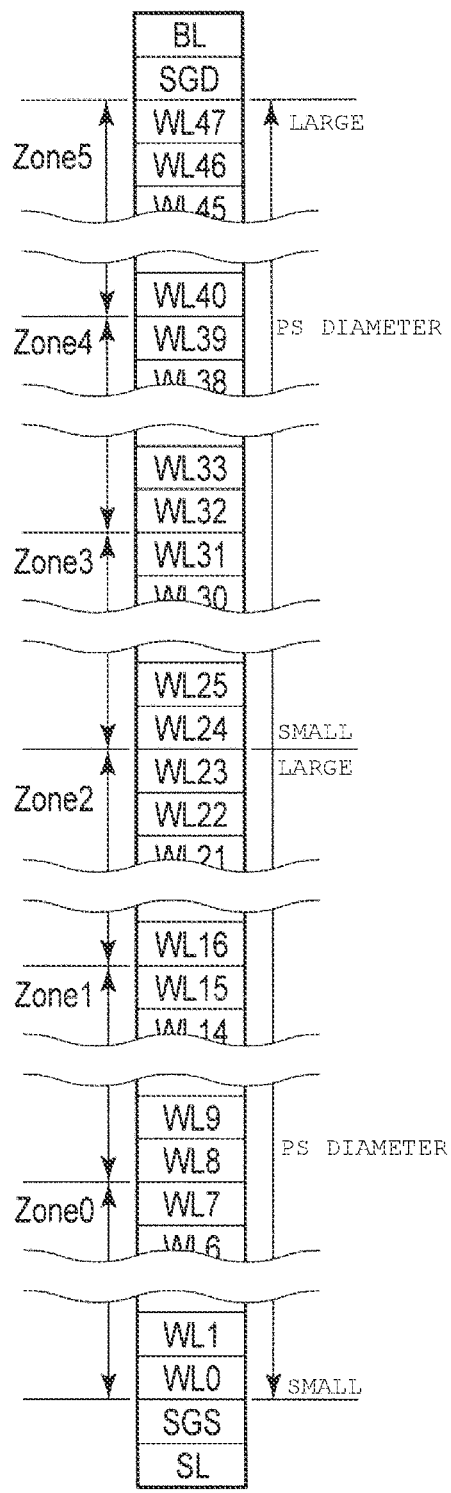
FIG. 6 is a view illustrating zones used during a verification operation of the memory system according to the first embodiment.

As illustrated in FIG. 6, in the first embodiment, the word lines WL0 to WL47 are divided into 6 areas (zones) during the verification operation. In specific, the word lines WL0 to WL7 are set to a zone 0, the word lines WL8 to WL15 are set to a zone 1, the word lines WL16 to WL23 are set to a zone 2, the word lines WL24 to WL31 are set to a zone 3, the word lines WL32 to WL39 are set to a zone 4, and the word lines WL40 to WL47 are set to a zone 5.

In the memory system 1 according to the first embodiment, for example, the verification voltage is set in each of the zones during the verification operation.

Regarding Erasing Operation of Data

Next, an erasing operation of the memory system 1 according to the first embodiment will be described with reference to FIGS. 7 to 9.

The erasing operation is an operation of setting a threshold voltage of the memory cell transistors MT to a low state. The erasing operation includes that the sequencer 121 performs voltage application and erasing verification with respect to the memory cell transistors MT.

Step S101

The sequencer 121 applies a voltage VSWL to the word lines WL in order to perform the erasing operation. Hereinafter, a specific example of an erasing voltage according to the present embodiment will be described with reference to FIGS. 4, 8A to 8C, and 9.

As illustrated in FIGS. 4 and 8A to 8C, the PS diameter differs in each of the memory cell transistors MT. As described above, the relationship between the PS diameters of the memory cell transistors MT0, MTm, and MT23 is $dPS_0 < dPS_m < dPS_{23}$. The relationship between the PS diameters of the memory cell transistors MT24, MTn, and MT47 is $dPS_{24} < dPS_n < dPS_{47}$.

Here, a method of applying the voltage VSWL to each of the word lines WL will be described. As described above, the PS diameter differs in each of the memory cell transistors MT. As a result, the characteristics differ in each of the memory cell transistors MT. For example, the $dPS_0$ as the PS diameter of the memory cell transistor MT0 is smaller than the $dPS_1$ as the PS diameter of the memory cell transistor MT1. For this reason, data of the memory cell transistor MT0 is easily erased, compared to that of the memory cell transistor MT1 (erasing rate is high). In other words, when the PS diameter of the memory cell transistor MT is small, the data is easily erased (erasing rate is high). When the PS diameter of the memory cell transistor MT is large, the data is not easily erased (erasing rate is low). In the present embodiment, an adequate voltage VSWL is selected in each of the word lines WL to be applied. In specific, the sequencer 121 makes the value of a voltage VSWL_WL0, which is applied to the word line WL0 corresponding to the memory cell transistor MT0, larger than that of a voltage VSWL_WL1, which is applied to the word line WL1 corresponding to the memory cell transistor MT1 (VSWL_WL0>VSWL_WL1). Similarly, the voltage VSWL is set to be small sequentially from the memory cell transistor MT0 to the memory cell transistor MT23 (VSWL_WL0>VSWL_WL1> . . . >VSWL_WLm> . . . > VSWL_WL23).

The voltage VSWL_WL23 which is applied to the word line WL23 corresponding to the memory cell transistor MT23 is set to be smaller than the voltage VSWL_WL24 which is applied to the word line WL24 corresponding to the memory cell transistor MT24. This is because the $dPS_{23}$ as the PS diameter of the memory cell transistor MT23 is larger than the $dPS_{24}$ as the PS diameter of the memory cell transistor MT24.

The sequencer 121 makes the value of voltage VSWL_WL24 (VSWL_WL24=VSWL_WL0> . . . > VSWL_WL23), which is applied to the word line WL24 corresponding to the memory cell transistor MT24, larger than that of voltage VSWL_WL25, which is applied to the word line WL25 corresponding to the memory cell transistor MT25 (VSWL_WL24>VSWL_WL25). Similarly, the voltage VSWL is set to be small sequentially from the memory cell transistor MT24 to the memory cell transistor MT47 (VSWL_WL24>VSWL_WL25> . . . >VSWL_WLn> . . . > VSWL_WL47=VSWL_WL23).

The erasing voltage is applied in accordance with the PS diameter of the memory cell transistor MT in this manner.

Step S102

As illustrated in the following Steps S102 to S106, for example, the sequencer 121 performs erasing verification in each of the above-described zones after performing block erasing. First, the sequencer 121 selects a zone 0 (i=0) as a zone i (i is an integer of 0 or greater) and performs the erasing verification.

Step S103

The sequencer 121 confirms whether the word line WLi already passed the erasing verification.

Step S104

In Step S104, the sequencer 121 performs the erasing verification with respect to the zone i when it is determined that the zone i has not passed the erasing verification yet.

Step S105

The sequencer 121 determines whether the zone i is the last zone in the block in which the erasing is performed.

Step S106

The sequencer 121 replaces i with i+1 and performs Steps S103 to S105 again when the sequencer 121 determines that the zone i is not the last zone in the block in which the erasing is performed.

Step S107

In Step S107, the sequencer 121 determines whether all of the zones in the block to be erased pass the erasing verification or not when it is determined that the zone is the last zone in that block in which the erasing is performed.

Here, when the sequencer 121 determines that all of the zones in the block to be erased have not passed the erasing verification, the process returns to Step S101.

When the process returns to Step S101, in order to perform the erasing operation, the sequencer 121 applies voltage VSWL or voltage VUWL (VUWL>VSWL)) to respective word lines WL so as not to erase a word line WL that already passed the erasing verification and to erase a word line WL that has not passed the erasing verification yet.

The sequencer 121 finishes the block erasing when it is determined that all of the zones in the block to be erased pass the erasing verification.

Figures 8A, 8B, 8C:
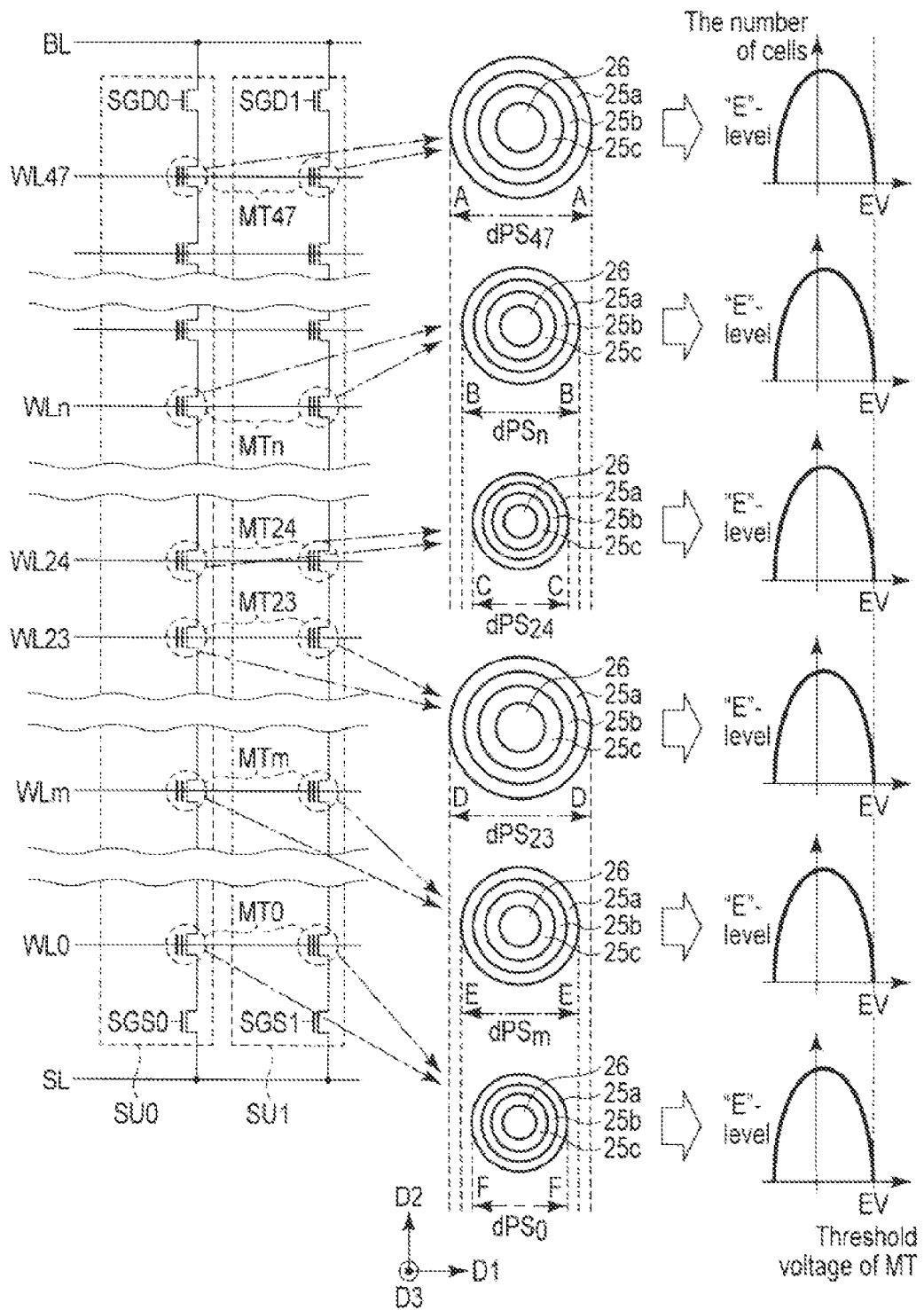
FIG. 8A is a circuit diagram of the memory cell array according to the first embodiment.
FIG. 8B is a cross-sectional view of the memory cell transistors illustrated in FIG. 8A.
FIG. 8C is a graph illustrating a threshold value distribution of the memory cell transistors according to FIG. 8A and FIG. 8B.
Figure 9:
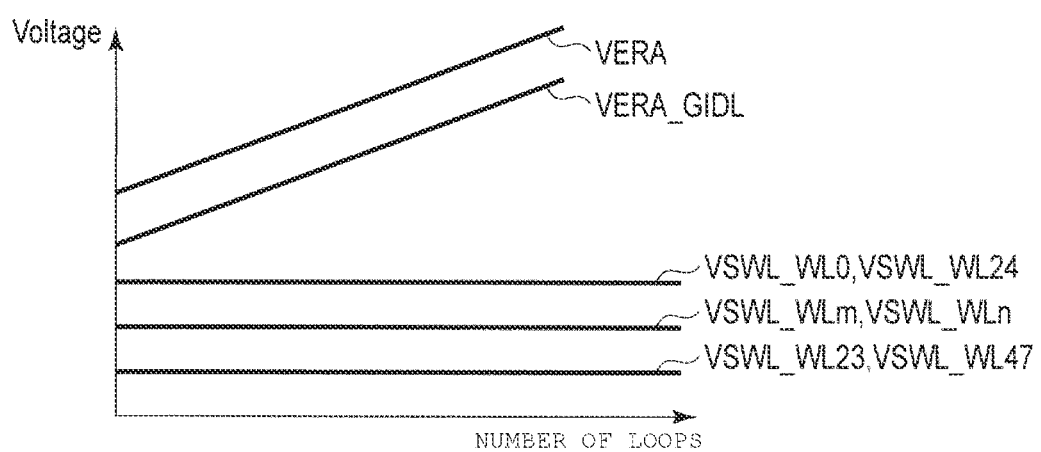
FIG. 9 is a graph illustrating a relationship between a voltage, which is applied to the memory cell transistors according to the first embodiment, during an erasing operation, and a loop frequency during the erasing operation.

As illustrated in FIG. 8A to FIG. 8C, the variation of the erased level ("E" level) is suppressed in the memory cell transistors MT0 to MT47 that respectively have different PS diameters by performing the above-described erasing operation.

Effect of First Embodiment

As described above, according to the memory system according to the first embodiment, the $dPS_1$ as the PS diameter of the memory cell transistor MT1 formed on the memory cell transistor MT0 is larger than the $dPS_0$ as the PS diameter of the memory cell transistor MT0. In the present embodiment, the PS diameter sequentially becomes larger from the memory cell transistor MT0 to the memory cell transistor MT23. However, the $dPS_{24}$ as the PS diameter of the memory cell transistor MT24 formed on the memory cell transistor MT23 is smaller than the $dPS_{23}$ as the PS diameter of the memory cell transistor MT23. The PS diameter sequentially becomes larger from the memory cell transistor MT24 to the memory cell transistor MT47.

The sequencer 121 according to the present embodiment applies word line WL-applying voltage to each of the word lines WL0 to WL47 during the erasing operation in accordance with the differences of the PS diameters of the memory cell transistor MT.

The sequencer 121 according to the present embodiment makes a voltage VSWL, which is applied to a word line WL of a memory cell transistor MT, larger as the PS diameter of the memory cell transistor MT is smaller during the erasing operation. Moreover, the sequencer 121 makes a voltage VSWL, which is applied to a word line WL of a memory cell transistor MT, smaller as the PS diameter of the memory cell transistor MT is larger during the erasing operation.

Accordingly, it is possible to arrange the erased level after the erasing operation in the memory cell transistors MT that have different PS diameters from each other.

It is possible to suppress the variation of the erased level ("E" level) after the erasing operation in the memory cell transistors MT in which the erasing rate is different from each other as a result of having different PS diameters as illustrated in FIG. 8A to FIG. 8C, by performing the erasing operation as described in the first embodiment. As a result, it is possible to suppress any excessive erasing in memory cell transistor MT having a small PS diameter (high erasing rate) as described in conjunction with FIG. 8A to FIG. 8C.

In other words, according to the erasing operation described in the first embodiment, it is possible to suppress any deterioration or the like of the memory cell transistors MT by applying different voltages VSWL based on the PS diameter between the layers. As a result, it is possible to provide a high-quality memory system 1.

According to the above-described first embodiment, the processing during the formation of the NAND strings 114 is divided into two stages. However, the number of times of processing is not limited thereto, and the NAND strings 114 may be formed through one processing step and may be formed through three or more processing steps.

Second Embodiment

Next, an erasing operation of the memory system 1 according to a second embodiment will be described. The erasing operation according to the second embodiment is different from that according to the first embodiment in that the voltage VSWL applied to a predetermined word line WL increases after desired number of times of the erasing operation is repeated. The basic configuration or the like of the memory system 1 according to the second embodiment is the same as that of the memory system 1 according to the above-described first embodiment, and therefore, the detailed description thereof will be omitted.

Regarding Erasing Operation of Data of Second Embodiment

An erasing operation of the memory system 1 according to the second embodiment will be described with reference to FIGS. 10 to 11B.

Step S201

The sequencer 121 applies an erasing voltage to the bit lines BL and applies a voltage to word lines WL. The sequencer 121 subsequently performs the erasing verification with respect to the word lines WL0 to WL47, for example.

Figure 7:
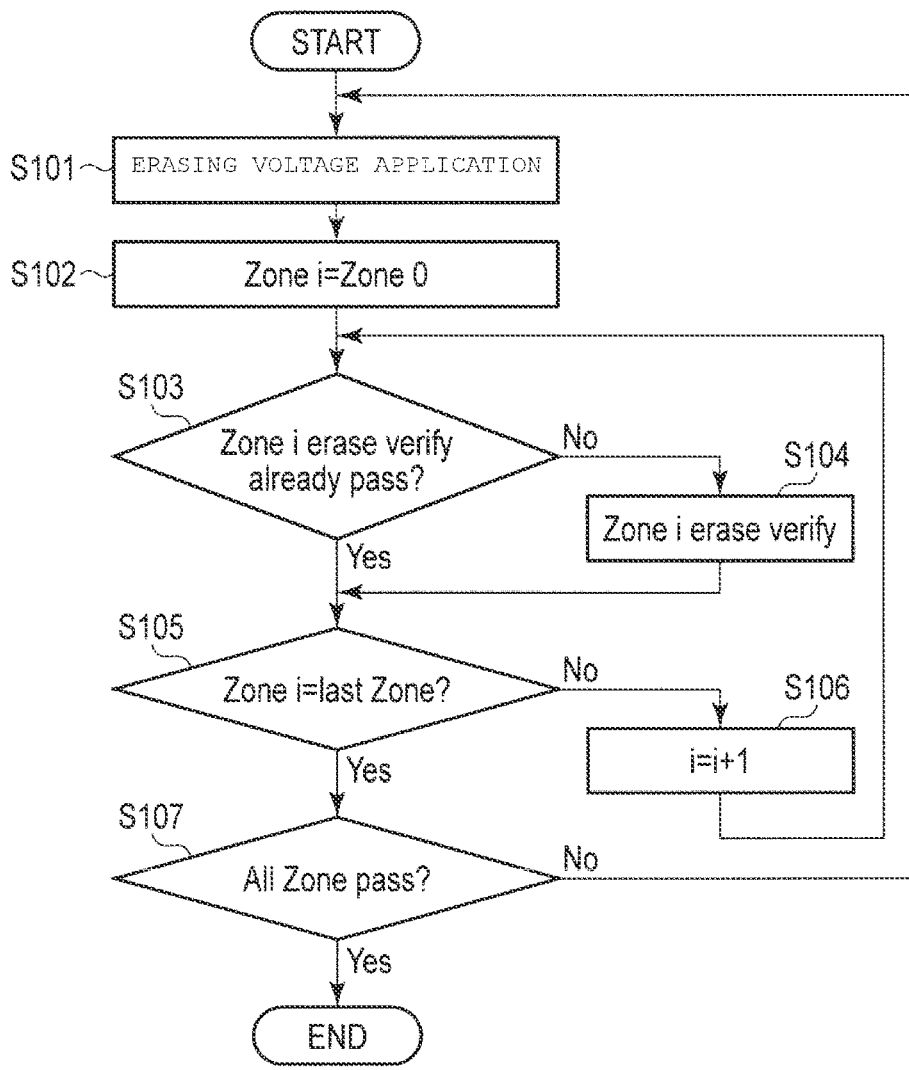
FIG. 7 is a flowchart illustrating an erasing operation of the memory system according to the first embodiment.

In the second embodiment, the voltage VSWL applied to the word lines WL in Step S201 is the same as the voltage VSWL described in Step S101 of FIG. 7 according to the above-described first embodiment.

Step S202

The sequencer 121 determines whether or not all of the zones in the block to be erased pass the erasing verification. Here, the process enters Step S203 when the sequencer 121 determines that all of the zones in the block to be erased have not passed the erasing verification.

The sequencer 121 completes the block erasing operation when it is determined that all of the zones in the block to be erased pass the erasing verification.

Step S203

The sequencer 121 determines whether or not the application of the erasing voltage on the bit lines BL and the voltage VSWL on the word lines WL, and the erasing verification are performed a first predetermined number of times. The process returns to Step S201 when the sequencer 121 determines that the application of the erasing voltage on the bit lines BL and the voltage VSWL on the word lines WL, and the erasing verification are not performed a first predetermined number of times. The loop of the application of the erasing voltage on the bit lines BL and the voltage VSWL on the word lines WL, and the erasing verification (erasing operation) is counted by the counter 125 or the like. The sequencer 121 performs the above-described determination by referring to the counter 125.

Step S204

The sequencer 121 increases the voltage VSWL for the predetermined word line WL when it is determined that the application of the erasing voltage on the bit lines BL and the voltage VSWL on the word lines WL, and the erasing verification have been performed the first predetermined number of times.

Figure 11A:
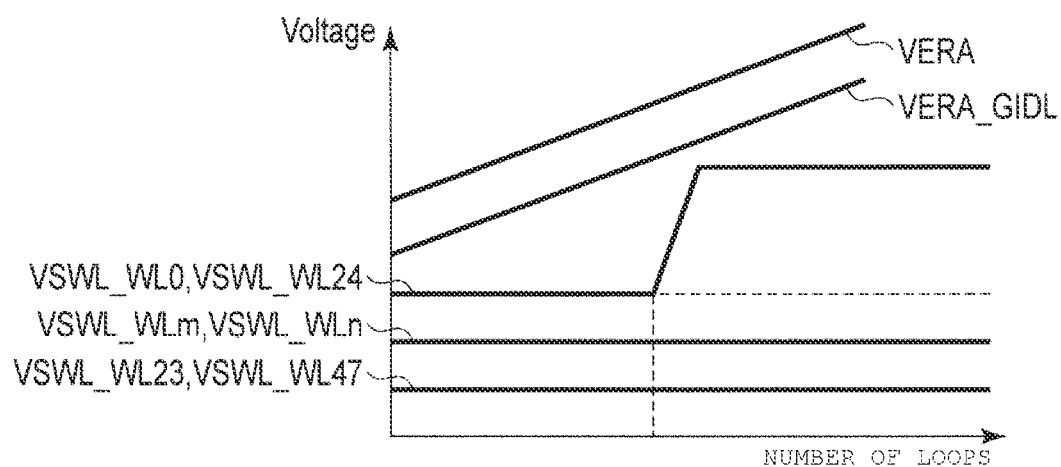
FIGS. 11A and 11B are graphs illustrating a relationship between a voltage, which is applied to the memory cell transistors according to the second embodiment, during an erasing operation, and a loop frequency during the erasing operation.

As described above, data is easily erased as the PS diameter of the memory cell transistor MT is smaller. Therefore, the voltages VSWL_WL0 and VSWL_WL24 for word lines WL (for example, WL0, WL24, and the like) that belong to memory cell transistors MT (for example, MT0, MT24, and the like) having a small PS diameter increases as illustrated in FIGS. 11A and 11B. The increased voltage may be variously changed as long as the voltage is a voltage (for example, voltage VUWL (VUWL>VSWL) with which the memory cell transistor MT is not easily erased. In addition, in Step S204, although only the two word lines such as WL0 and WL24 are described as increased word lines WL, embodiments are not limited thereto and various modifications may be appropriately made.

Step S205

The sequencer 121 performs erasing operation the same as that in Step S201 after increasing the voltage VSWL of the predetermined word line WL in Step S205.

Step S206

The sequencer 121 determines whether or not the erasing operation is performed the second predetermined number of times (first predetermined number of times<second predetermined number of times (loop max)) by referring to the counter 125 or the like. The process returns to Step S205 when the sequencer 121 determines that the erasing operation is not performed the second predetermined number of times.

Step S207

The sequencer 121 determines whether all of the zones in the block to be erased pass the erasing verification when it is determined that the erasing operation is performed the second predetermined number of times in Step S206.

Here, the sequencer 121 determines that the erasing operation of the block to be erased failed when it is determined that all of the zones in the block to be erased have not passed the erasing verification.

In addition, the sequencer 121 finishes the block erasing operation when it is determined that all of the zones in the block to be erased pass the erasing verification.

Effect of Second Embodiment

As described above, according to the memory system according to the second embodiment, the sequencer 121 increases the voltage VSWL for the word lines WL that belong to memory cell transistors MT having a small PS diameter after performing the erasing operation a predetermined number of times.

It is possible to suppress any excessive erasing by performing such an erasing operation. As a result, it is possible to provide a high-quality memory system 1 that may suppress any deterioration or the like of the memory cell transistors MT.

The second embodiment may be applied even to the above-described first embodiment.

In addition, in the second embodiment, the sequencer 121 may increase a voltage VSWL for a first word line WL when it is determined that the erasing operation is performed the first predetermined number of times. Furthermore, the sequencer 121 may increase a voltage VSWL for a second word line WL when it is determined that the erasing operation is performed the second predetermined number of times.

Figure 11B:
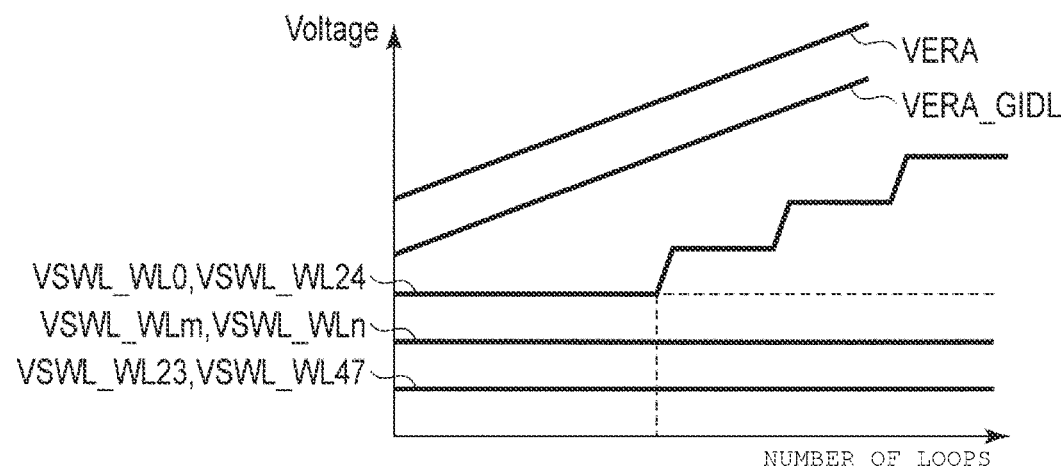

In the second embodiment, as illustrated in FIG. 11B, the sequencer 121 may increase the voltage VSWL for the word line WL that belongs to the memory cell transistor MT having a small PS diameter in a step-up manner every time the erasing operation performs a predetermined number of times.

Third Embodiment

Next, an erasing operation of the memory system 1 according to a third embodiment will be described. The erasing operation according to the third embodiment is different from those according to the first and the second embodiments in that different verification levels are set in each of the zones, and the sequencer 121 detects the pass of the erasing verification of the memory cell transistor MT having a small PS diameter (high erasing rate) and increases the voltage VSWL for the word line WL that belongs to the passed memory cell transistor MT. The basic configuration or the like of the memory system 1 according to the third embodiment is the same as that of the memory system 1 according to the above-described first embodiment, and therefore, the detailed description thereof will be omitted.

Regarding Erasing Operation of Data of Third Embodiment

An erasing operation of the memory system 1 according to the third embodiment will be described with reference to FIGS. 12A, 12B, 12C and 13.

Step S301

Figure 10:
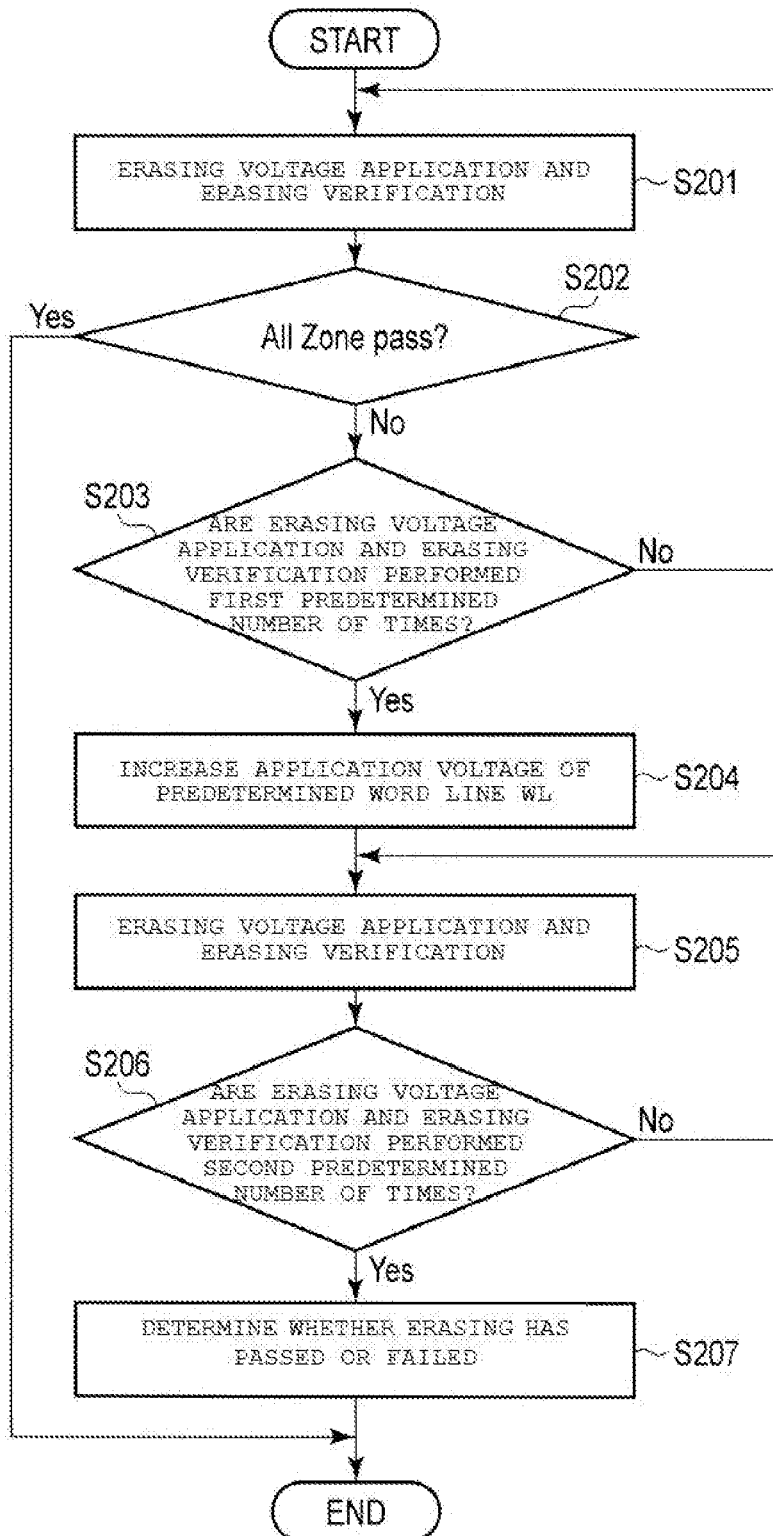
FIG. 10 is a flow chart illustrating an erasing operation of a memory system according to a second embodiment.

The sequencer 121 performs an erasing operation the same as the erasing operation described in Step S201 of FIG. 10 according to the above-described first embodiment.

Step S302

However, in the memory system 1 according to the present embodiment, different verification levels are set in each of the zones based on the PS diameter of the memory cell transistor MT.

Figures 12A, 12B, 12C:
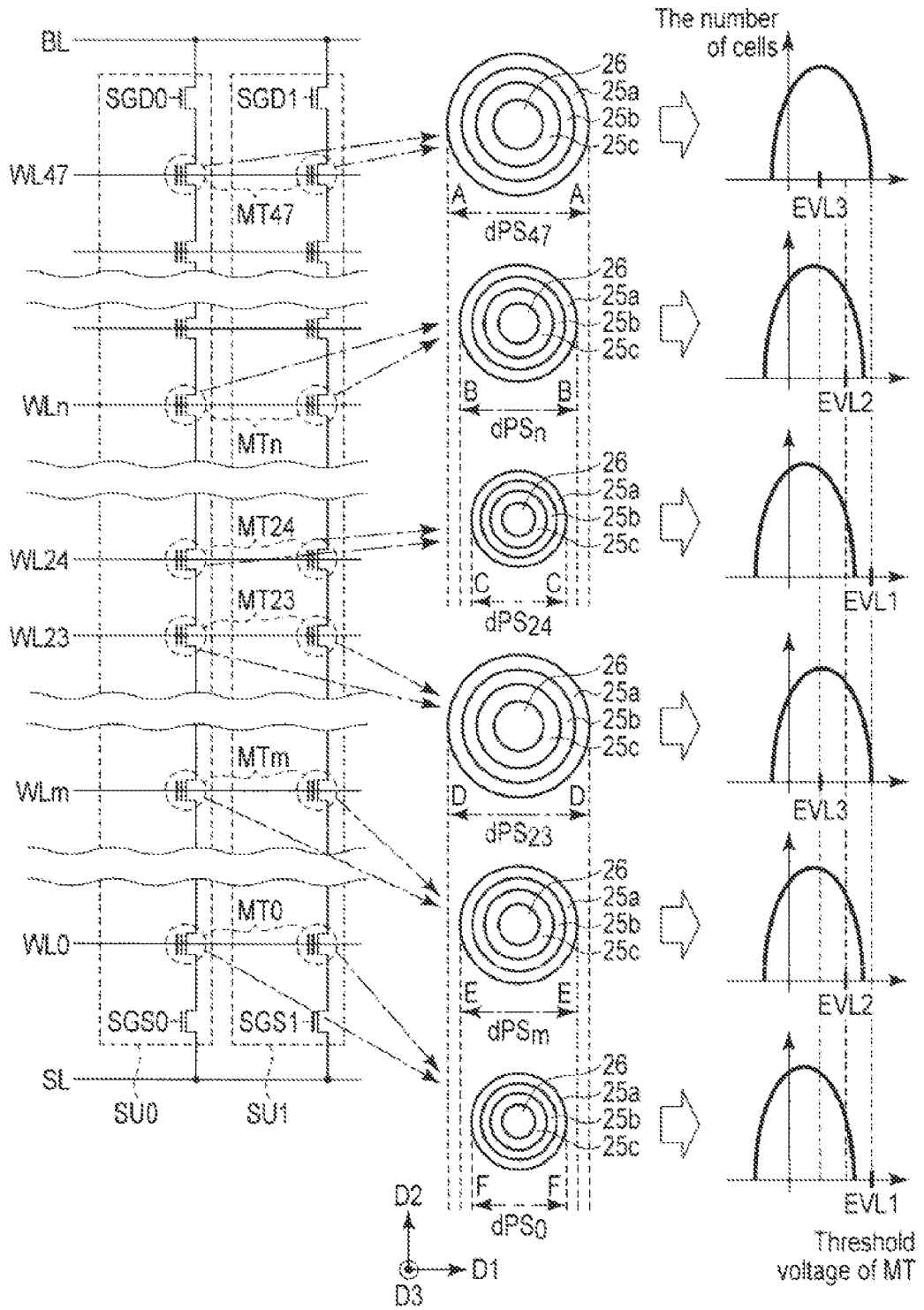
FIG. 12A is a circuit diagram of a memory cell array according to a third embodiment.
FIG. 12B is a cross-sectional view of memory cell transistors illustrated in FIG. 12A.
FIG. 12C is a graph illustrating a threshold value distribution of the memory cell transistors according to FIG. 12A and FIG. 12B.

As illustrated in FIG. 12A to FIG. 12C, in the memory system 1 according to the present embodiment, a verification level EV1 is set to a zone 0 to which the memory cell transistors MT0 to MT7 belong and to a zone 3 to which the memory cell transistors MT24 to MT31 belong. In addition, in the memory system 1, a verification level EV2 (EV1>EV2) is set to a zone 1 to which the memory cell transistors MT8 to MT15 belong and to a zone 4 to which the memory cell transistors MT32 to MT39 belong. In addition, in the memory system 1, a verification level EV3 (EV1>EV2>EV3) is set to a zone 2 to which the memory cell transistors MT16 to MT23 belong and to a zone 5 to which the memory cell transistors MT40 to MT47 belong.

Here, a case where the three verification levels are prepared as the verification levels assigned to the memory cell transistors MT will be described. The number of the verification levels is not limited thereto, and any number of the verification levels may be prepared as long as the number of the verification levels is 2 or more.

The sequencer 121 determines whether or not a zone to which the verification level (EVL1) is set to pass the erasing verification. The sequencer 121 repeats the operation in Step S301 when it is determined that a zone to which the verification level (EVL1) is set has not passed the erasing verification.

Step S303

Figure 13:
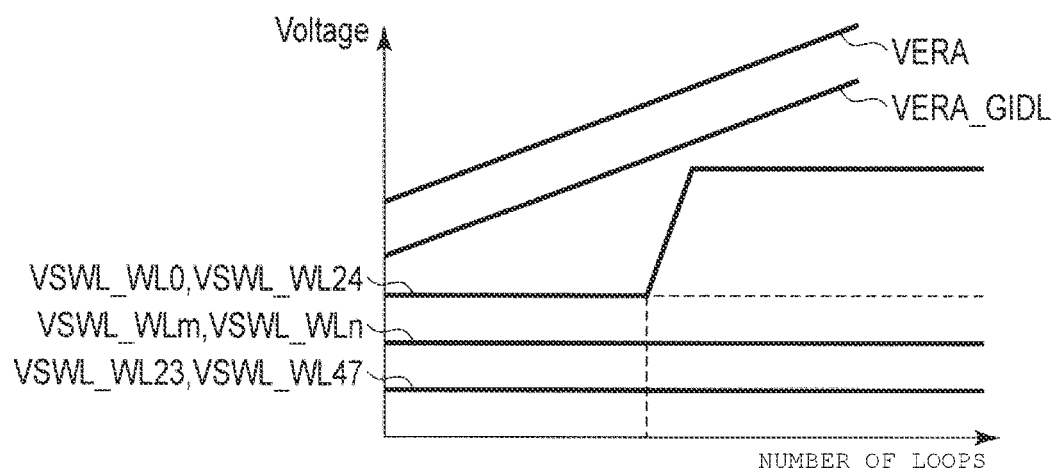
FIG. 13 is a graph illustrating a relationship between a voltage, which is applied to the memory cell transistors according to the third embodiment, during an erasing operation, and a loop frequency during the erasing operation.

The sequencer 121 increases a voltage VSWL for a word line WL of a memory cell transistor MT that belongs to the zone to which the verification level (EVL1) is set as illustrated in FIG. 13 when it is determined that the zone to which the verification level (EVL1) is set to pass the erasing verification.

More specifically, the sequencer 121 increases voltages VSWL_WL0 and VSWL_WL24 for word lines WL (for example, WL0, WL24, and the like) that belong to memory cell transistors MT (for example, MT0, MT24, and the like) having a small PS diameter. The increased voltage may be variously changed as long as the voltage is a voltage (for example, voltage VUWL (VUWL>VSWL)) with which the memory cell transistor MT is not easily erased. In addition, in Step S303, although only the two word lines such as WL0 and WL24 are described as increased word lines WL, embodiments are not limited thereto and various modifications may be appropriately made.

Step S304

The sequencer 121 performs an erasing operation the same as that in Step S301 after increasing the voltage VSWL of the predetermined word line WL in Step S303.

Step S305

The sequencer 121 determines whether or not all of the zones in the block to be erased pass the erasing verification.

Here, the sequencer 121 repeats the operation in Step S304 when it is determined that all of the zones in the block to be erased have not passed the erasing verification.

The sequencer 121 finishes the block erasing operation when it is determined that all of the zones in the block to be erased pass the erasing verification.

Effect of Third Embodiment

As described above, according to the memory system according to the third embodiment, different verification levels are set in each of the zones. Moreover, the sequencer 121 increases the voltage VSWL for the word lines WL that belong to memory cell transistors MT that belong to the zones when zones, in which the verification level (EVL1) is set, pass the verification.

It is possible to suppress any excessive erasing in memory cell transistors MT having a small PS diameter similarly to the above-described second embodiment by performing such an erasing operation. As a result, it is possible to suppress any deterioration or the like of the memory cell transistors MT, thereby providing a high-quality memory system 1.

The third embodiment may be applied even to the above-described first and second embodiments.

Fourth Embodiment

Next, an erasing operation of the memory system 1 according to a fourth embodiment will be described. The basic configuration or the like of the memory system 1 according to the fourth embodiment is the same as that of the memory system 1 according to the above-described first embodiment, and therefore, the detailed description thereof will be omitted.

Regarding Erasing Operation of Data of Fourth Embodiment

An erasing operation of the memory system according to the fourth embodiment will be described with reference to FIGS. 14A to 15B.

As illustrated in FIGS. 14A to 15B, in the fourth embodiment, the word lines WL0 to WL47 are divided into 6 areas (zones). More specifically, the word lines WL0 to WL7 are set to a zone 0, the word lines WL8 to WL15 are set to a zone 1, the word lines WL16 to WL23 are set to a zone 2, the word lines WL24 to WL31 are set to a zone 3, the word lines WL32 to WL39 are set to a zone 4, and the word lines WL40 to WL47 are set to a zone 5. However, as described in the first embodiment, the PS diameter becomes larger from the word line WL0 to the word line WL23. In addition, the PS diameter becomes larger from the word line WL24 to the word line WL47.

Figure 14A:
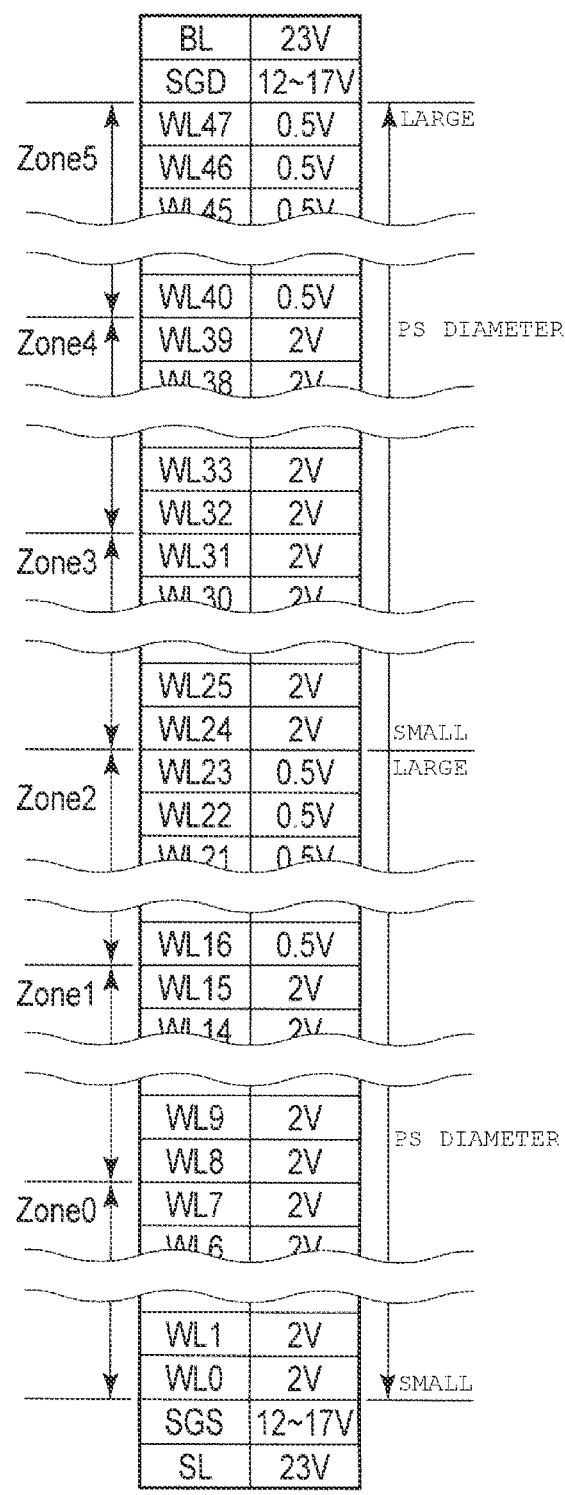
FIGS. 14A and 14B are views illustrating an example of an erasing operation of a memory system according to a fourth embodiment.
Figure 14B:
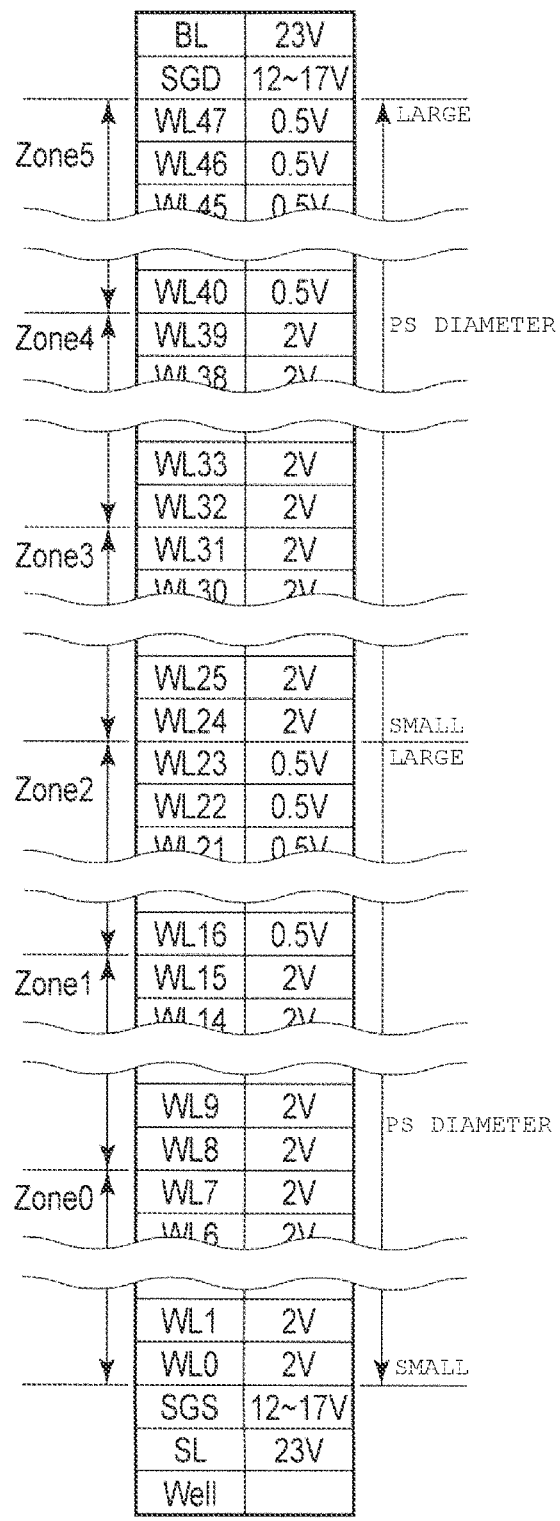

As illustrated in FIGS. 14A and 14B, in the memory system 1 according to the fourth embodiment, for example, the voltage VSWL is set in each of the zones during the erasing operation. For example, a higher voltage VSWL than a voltage VSWL applied to the zone 2 is applied to the zones 0 and 1. In addition, a higher voltage VSWL than a voltage VSWL applied to the zone 5 is applied to the zones 3 and 4.

Figure 15A:
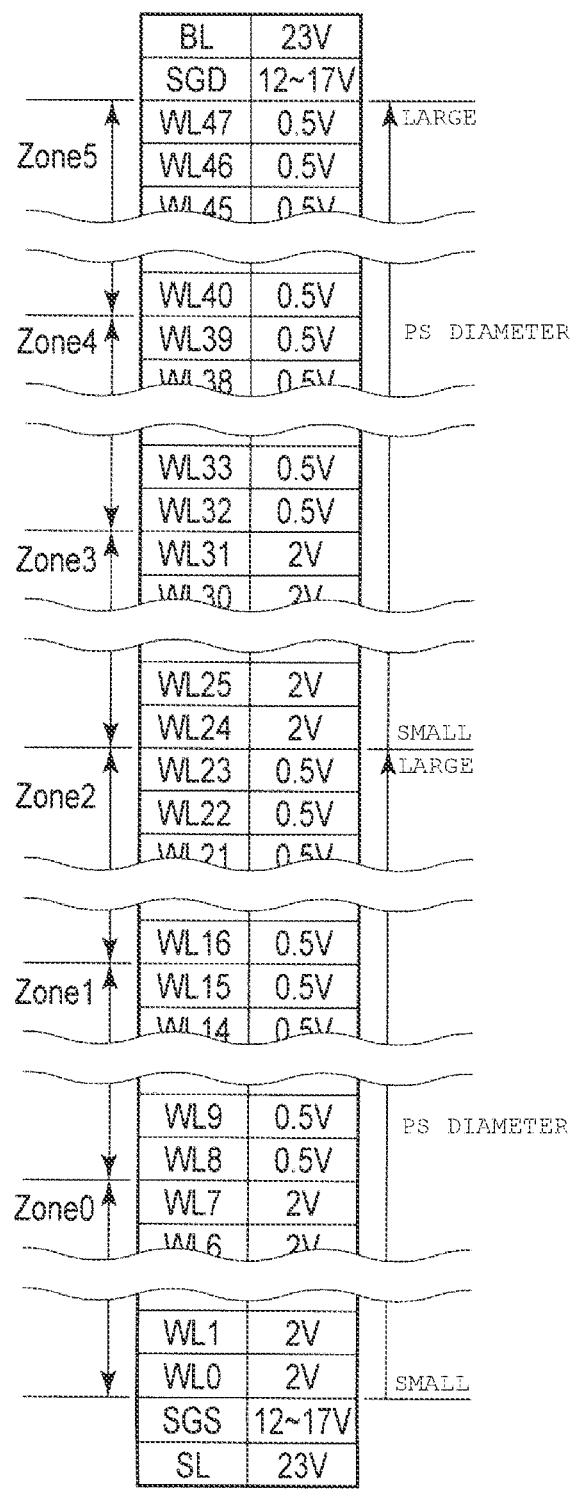
FIGS. 15A and 15B are views illustrating another example of the erasing operation of the memory system according to the fourth embodiment.
Figure 15B:
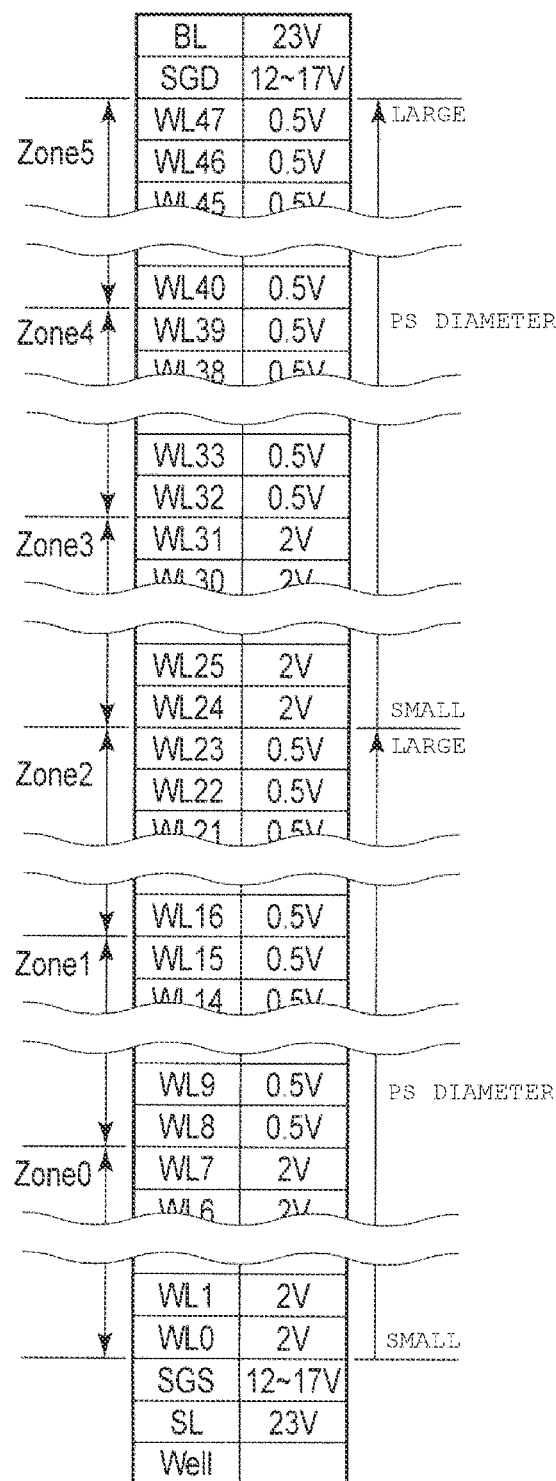

More specifically, in FIGS. 14A and 15B, the voltage VSWL in the zones 0, 1, 3, and 4 is set to 2 V and the voltage VSWL in the zones 2 and 5 is set to 0.5 V, for example.

In addition, as illustrated in FIGS. 15A and 15B, in the memory system 1 according to the fourth embodiment, for example, a higher voltage VSWL than a voltage VSWL applied to the zones 1 and 2 is applied to the zone 0 during the erasing operation. In addition, a higher voltage VSWL than a voltage VSWL applied to the zones 4 and 5 is applied to the zone 3.

More specifically, in FIGS. 14A and 14B, the voltage VSWL in the zones 0 and 3 is set to 2 V and the voltage VSWL in the zones 1, 2, 4 and 5 is set to 0.5 V, for example.

Effect of Fourth Embodiment

As described above, according to the memory system according to the fourth embodiment, the voltage VSWL is set in each of the areas (zones) of the word lines WL.

As described above, it is possible to obtain an effect the same as that according to the first embodiment using a pump driver which is smaller compared to that in the method of controlling the voltage VSWL in each of the word lines WL, by controlling the voltage VSWL in each of the zones. As a result, it is possible to provide a high-quality memory system 1 which may suppress any deterioration or the like of the memory cell transistors MT.

According to the above-described fourth embodiment, six zones are prepared. However, embodiments are not limited thereto, and any number of zones may be fine as long as the group of the memory cell transistors MT having a small PS diameter may be distinguished from the group of the memory cell transistors MT having a large PS diameter. In addition, the method of defining the zones may be variously changed. Furthermore, although the voltage applied to each wiring is clearly specified in the above-described fourth embodiment, the specification is merely an example. Moreover, the voltage VSWL applied to each zone or the voltage applied to each wiring may be variously changed. The same principle also applies to other embodiments.

The fourth embodiment may be applied even to the above-described second and third embodiments.

In addition, FIGS. 14A and 15A shows a three-dimensional stacked NAND flash memory that performs erasing by using Gate-Induced-Drain-Leakage current (GIDL). However, as illustrated in FIGS. 14B and 15B, the principle may also be applied to a three-dimensional stacked NAND flash memory that performs erasing of a well. The well erasing method is described in U.S. Patent Application Pub. No. 2012/0243338, the entire contents of which are incorporated by reference herein.

In addition, the above-described definition of the zones is merely an example and may be appropriately changed without being limited thereto.

Fifth Embodiment

Next, an erasing operation of the memory system 1 according to a fifth embodiment will be described. In the fifth embodiment, the word lines WL are divided into predetermined areas (zones) and the erasing operation is performed in each of the zones. The erasing operation of the fifth embodiment is different from those of the first to fourth embodiments in that the setting of the bit lines BL is changed in accordance with the zones performing the erasing operation which is performed at different timings. The basic configuration or the like of the memory system 1 according to the fifth embodiment is the same as that of the memory system 1 according to the above-described first embodiment, and therefore, the detailed description thereof will be omitted.

Regarding Erasing Operation of Data of Fifth Embodiment

Figure 16:
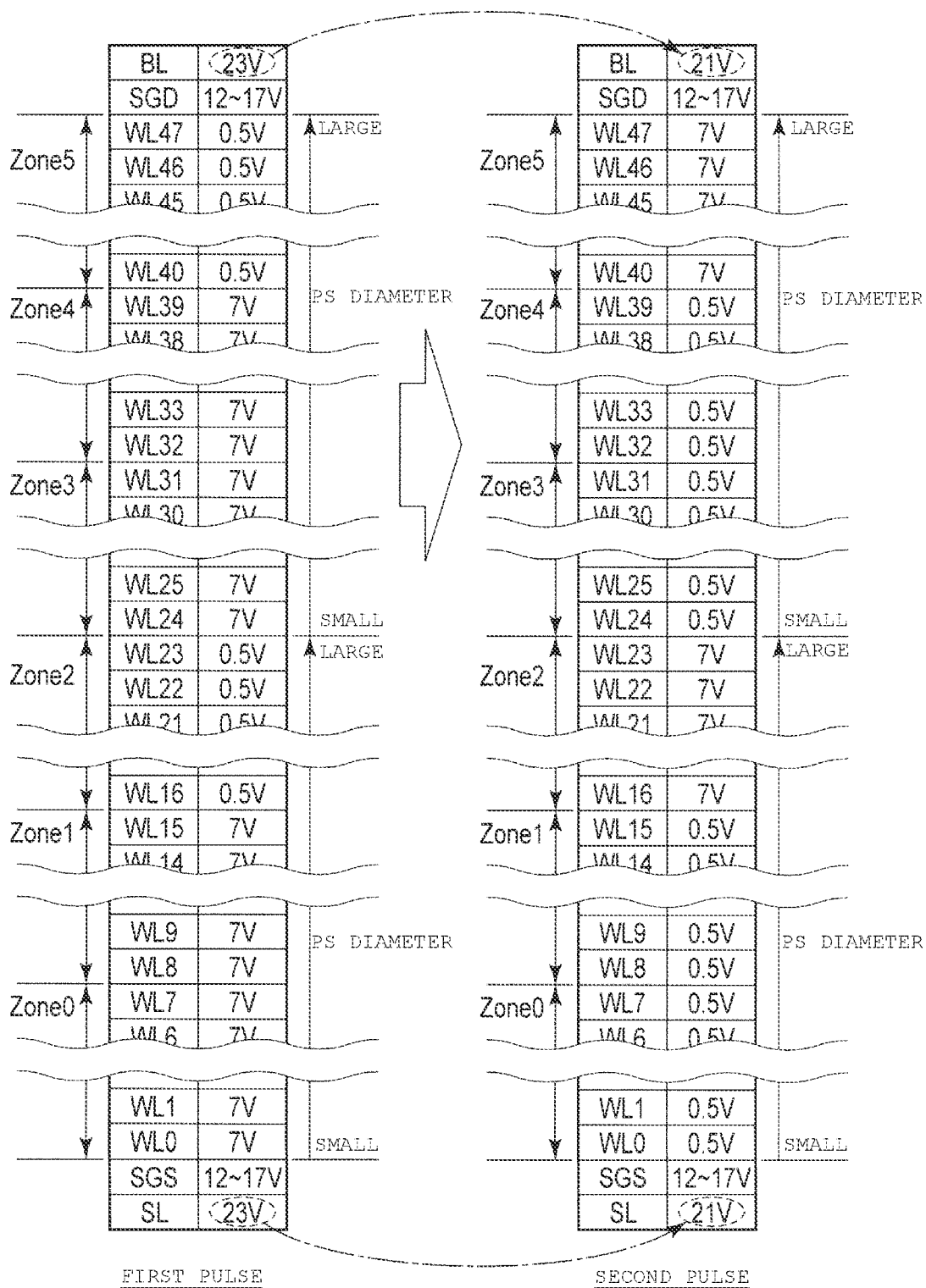
FIG. 16 is a view illustrating an example of an erasing operation of a memory system according to a fifth embodiment.

An erasing operation of the memory system according to the fifth embodiment will be described with reference to FIG. 16. As illustrated in FIG. 16, in the fifth embodiment, the word lines WL0 to WL47 are divided into 6 areas (zones) similarly to the fourth embodiment. The method of defining the zones is the same as that in the fourth embodiment, and therefore, the description thereof will be omitted.

In the erasing operation of the memory system 1 according to the fifth embodiment, application of the voltage VSWL is divided into two stages. In specific, as illustrated in FIG. 16, the sequencer 121 first applies an erasing voltage (23 V) to the bit lines BL, applies a voltage VUWL (7 V) to zones to which memory cell transistors MT having a high erasing rate (small PS diameter) belong, and applies a voltage VSWL (0.5 V) to zones to which memory cell transistors MT having low erasing rate (large PS diameter) belong (first pulse). Subsequently, the sequencer 121 reduces the erasing voltage applied to the bit lines BL (to 21 V) being less than the first voltage, applies a voltage VSWL (0.5 V) to zones to which memory cell transistors MT having a small PS diameter belong, and applies a voltage VUWL (7 V) to zones to which memory cell transistors MT having large PS diameter belong (second pulse). Then, the sequencer 121 performs the erasing verification.

Effect of Fifth Embodiment

As described above, according to the memory system according to the fifth embodiment, the data of the memory cell transistors MT having a low erasing rate is first erased earlier than the memory cell transistors MT having a high erasing rate. In specific, the word lines WL are divided into areas (zones) to erase the divided zones at different timings. Moreover, it is possible to reduce the potential difference in the memory cell transistors MT having a small PS diameter by reducing the voltage for the bit lines when the voltage VSWL is applied to the zones to which the memory cell transistors MT having a small PS diameter belong, compared to when the voltage VSWL is applied to the zones to which the memory cell transistors MT having a large PS diameter belong.

Accordingly, similarly to the above-described fourth embodiment, it is possible to suppress any variation of the erased level and any excessive erasing in the memory cell transistors MT having different PS diameters during easily controlling the voltage VSWL, compared to when controlling the voltage VSWL in each of the word lines WL. As a result, it is possible to provide a high-quality memory system 1 that may suppress any deterioration or the like of the memory cell transistors MT.

In the erasing operation of the memory system 1 according to the above-described fifth embodiment, although the application of the voltage VSWL is performed by being divided into two stages, the application thereof may be divided into three or more stages without being limited thereto.

In addition, in the erasing operation of the memory system 1 according to the above-described fifth embodiment, although a voltage VSWL is applied to the group of the memory cell transistors MT having a large PS diameter in the first pulse and a voltage VSWL is applied to the group of the memory cell transistors MT having a small PS diameter in the second pulse, embodiments are not limited thereto. More specifically, during the operation of applying the voltage VSWL, the voltage VSWL may be applied to the zones to which the memory cell transistors MT having a small PS diameter and the voltage VUWL may be applied to the zones to which the memory cell transistors MT having a large PS diameter, as the first pulse, and the voltage VUWL may be applied to the zones to which the memory cell transistors MT having a small PS diameter and the voltage VSWL may be applied to the zones to which the memory cell transistors MT having a large PS diameter, as the second pulse.

In addition, during the erasing operation of the above-described fifth embodiment, the voltage to be applied to the bit lines BL may be appropriately changed as long as a value of the voltage is selected in the range where no excessive erasing occurs during the erasing operation of the memory cell transistors MT having a small PS diameter. For example, The sequencer 121 may apply the voltage VSWL on the group of the memory cell transistors MT having a small PS diameter in the first pulse and may increase the voltage, which is applied to the bit lines BL during the second pulse of the operation of applying the voltage VSWL, more than the voltage during the first pulse, when applying the voltage VSWL to the memory cell transistors MT having a large PS diameter in the second pulse.

In addition, although the voltage VUWL is set to 7 V in the above-described fifth embodiment, there is no restriction on the voltage VUWL. Similarly, the voltage VSWL is set to 0.5 V therein, but there is no restriction on the voltage VSWL.

In addition, the fifth embodiment may be applied even to the above-described first to third embodiments.

Sixth Embodiment

Next, an erasing operation of the memory system 1 according to a sixth embodiment will be described. The erasing operation according to the sixth embodiment is different from those according to the first to fifth embodiments in that the word lines WL are divided into predetermined areas (zones) and data of the group of the memory cell transistors MT having a small PS diameter and data of the group of the memory cell transistors MT having a large PS diameter are erased under different voltage conditions and at different timings. The basic configuration or the like of the memory system 1 according to the sixth embodiment is the same as that of the memory system 1 according to the above-described first embodiment, and therefore, the detailed description thereof will be omitted.

Regarding Erasing Operation of Data of Sixth Embodiment

An erasing operation of the memory system according to the sixth embodiment will be described with reference to FIG. 17.

Figure 17:
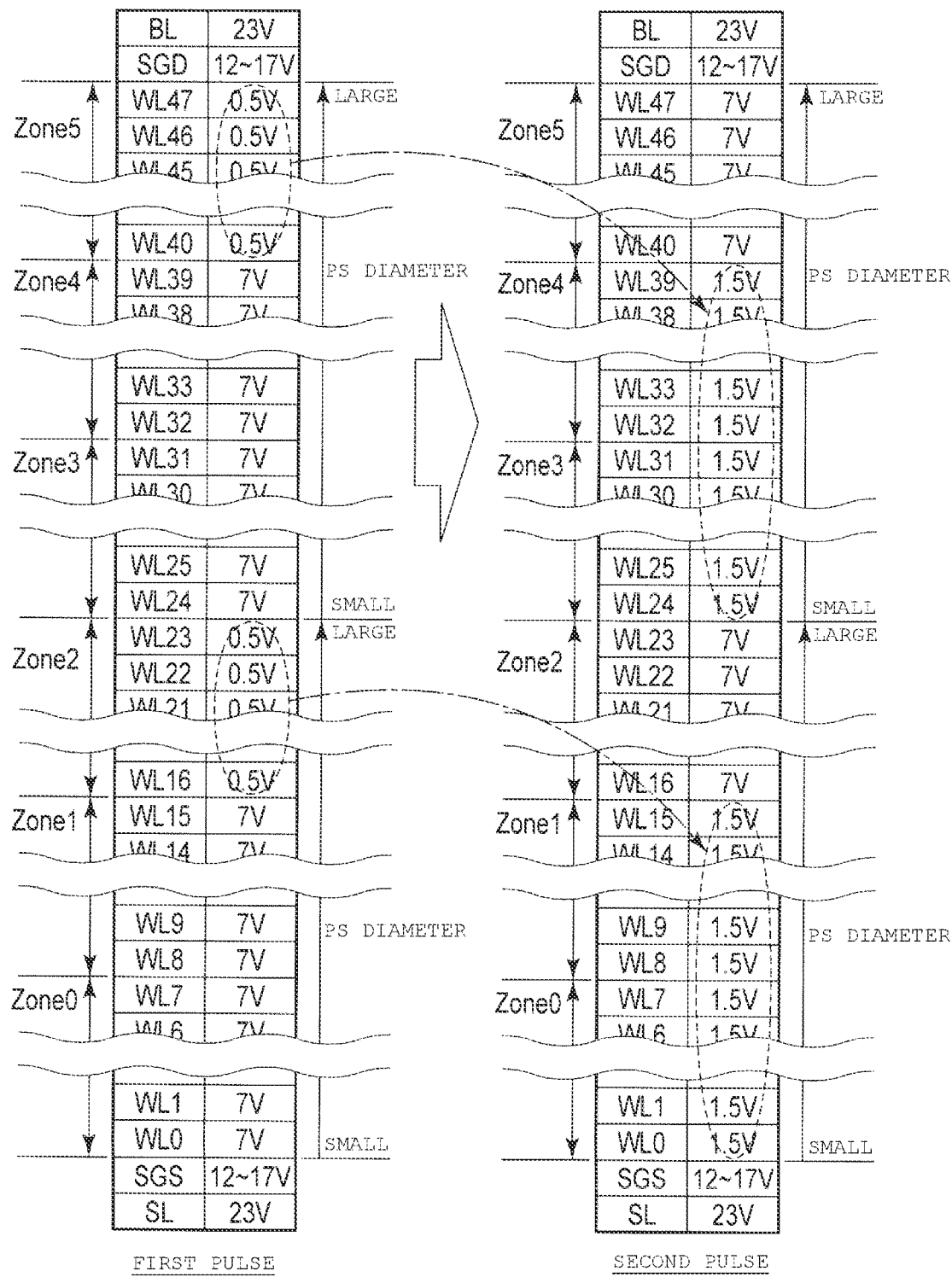
FIG. 17 is a view illustrating an example of an erasing operation of a memory system according to a sixth embodiment.

As illustrated in FIG. 17, in the sixth embodiment, the word lines WL0 to WL47 are divided into 6 areas (zones) similarly to the fourth embodiment. The method of defining the zones is the same as that in the fourth embodiment, and therefore, the description thereof will be omitted.

In the erasing operation of the memory system 1 according to the sixth embodiment, application of the voltage VSWL is divided into two stages. In specific, as illustrated in FIG. 17, the sequencer 121 first applies a voltage VUWL (7 V) to the zones 0, 1, 3, and 4, and applies a voltage VSWL (0.5 V) to zones 2 and 5 (first pulse). Subsequently, the sequencer 121 applies a voltage VSWL (1.5 V), which is higher than the voltage VSWL (0.5 V) in the first pulse, to the zones 0, 1, 3, and 4, and applies the voltage VUWL (7 V) to zones 2 and 5 (second pulse). Then, the sequencer 121 performs the erasing verification.

Effect of Sixth Embodiment

As described above, according to the memory system according to the sixth embodiment, the word lines WL are divided into predetermined areas (zones) to erase the divided zones at different timings. Moreover, it is possible to reduce the stress in the memory cell transistors MT having a small PS diameter by increasing the voltage VSWL when the voltage VSWL is applied to the zones to which the memory cell transistors MT having a small PS diameter belong, compared to when the voltage VSWL is applied to zones to which the memory cell transistors MT having a large PS diameter belong. Accordingly, it is possible to provide a high-quality memory system 1 similarly to the first embodiment.

The sixth embodiment may be applied even to the second, third, and fifth embodiments. In addition, although 6 zones are set in the sixth embodiment, the number of zones are not limited thereto and may be variously changed as long as the memory cell transistors MT having a small PS diameter is distinguishable from the memory cell transistors MT having a large PS diameter.

Although a voltage VSWL of 0.5 V is applied to the zones 2 and 5 and a voltage VSWL of 1.5 V is applied to the zones 0, 1, 3, and 4 during the erasing operation in the sixth embodiment, the voltage VSWL is not limited thereto and may be variously changed as long as the voltage VSWL applied to the zones, to which the memory cell transistors MT having a small PS diameter belong, is higher than the voltage VSWL applied to the zones, to which the memory cell transistors MT having a large PS diameter belong.

Seventh Embodiment

Next, a seventh embodiment will be described. In the seventh embodiment, the shape of the memory cell array 111 is different from those of the memory cell arrays 111 according to the first to the fifth embodiments. The basic configuration or the like of the memory system 1 according to the seventh embodiment is the same as that of the memory system 1 according to the above-described first embodiment, and therefore, the detailed description thereof will be omitted.

Regarding Memory Cell Array of Seventh Embodiment

The memory cell array according to the seventh embodiment will be described with reference to FIG. 18.

Figure 18:
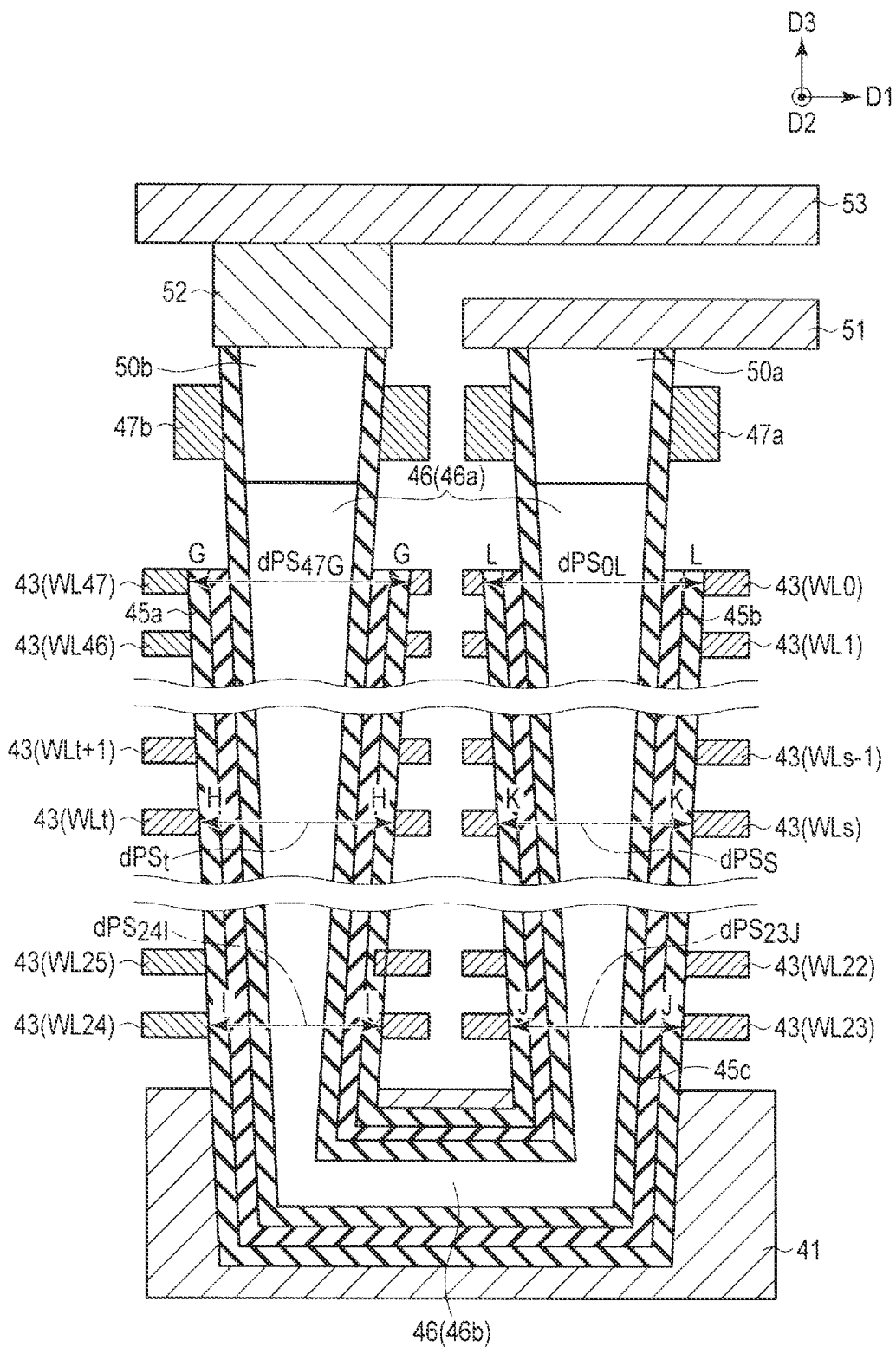
FIG. 18 is a cross-sectional view of a memory cell array according to a seventh embodiment.

The structure illustrated in FIG. 18 is arranged in the D2 direction in plural, and the structures share the word lines WL, the select gate lines SGD and SGS, and the back gate lines BG to form a string unit SU.

As illustrated in FIG. 18, a peripheral circuit such as the sense amplifier 113 is formed on the semiconductor substrate and the memory cell array 111 is formed on the peripheral circuit, for example. That is, as illustrated in FIG. 18, an electroconductive film (for example, polycrystalline silicon layers) 41 which functions as the back gate line BG is formed above the semiconductor substrate. Furthermore, electroconductive films (for example, polycrystalline silicon layers) 43 which function as the word lines WL are formed on the electroconductive film 41. Furthermore, the electroconductive films (for example, polycrystalline silicon layers) 47a and 47b which function as the select gate lines SGD and SGS are formed on the electroconductive films 43.

Moreover, memory holes (not illustrated) are formed within the above-described electroconductive films 47a, 47b, and 43. A block insulating film 45a, a charge storage layer (insulating film) 45b, and a gate insulating film 45c are sequentially formed on the inner wall of the memory holes, and an electroconductive film 46 is further embedded in the memory hole. The electroconductive film 46 functions as a current path of the NAND string 114, and is an area in which a channel is formed during the operation of the memory cell transistors MT.

Furthermore, the electroconductive films 50a and 50b are formed on the electroconductive film 46, a source line layer 51 is formed on the electroconductive film 50a and a bit line layer 53 is formed on the electroconductive film 50b via the electroconductive film 52.

As is also described in the first embodiment, the upper layer area is more etched compared to the lower layer area when the memory holes are formed in a multilayered film. Therefore, the MH diameters of the memory holes in the upper layer area are larger than the MH diameters of the memory holes in the lower layer area.

Here, for example, a PS diameter $dPS_0$ in the memory cell transistor MT0 is larger than a PS diameter $dPS_1$ in the memory cell transistor MT1 ($dPS_0 > dPS_1$). In addition, the PS diameter $dPS_0$ ($dPS_0 > dPS_1 > dPS_s$) in the memory cell transistor MTs (s is an integer from 2 to smaller than 23) is larger than a PS diameter $dPS_{s+1}$ ($dPS_0 > dPS_1 > dPS_s > dPS_{s+1}$) in the memory cell transistor MTs+1. In addition, a PS diameter $dPS_{22}$ ($dPS_0 > dPS_1 > dPS_s > dPS_{s+1} > dPS_{22}$) in the memory cell transistor MT22 is larger than a PS diameter $dPS_{23}$ ($dPS_0 > dPS_1 > dPS_s > dPS_{s+1} > dPS_{22} > dPS_{23}$) in the memory cell transistor MT23. That is, the PS diameter sequentially becomes smaller from the memory cell transistor MT0 to the memory cell transistor MT23 ($dPS_w > dPS_x$ (w<x); and w and x are integers from 0 to 23).

In addition, the PS diameter $dPS_{24}$ ($dPS_{24} = dPS_{23}$) in the memory cell transistor MT24 is smaller than the PS diameter $dPS_{25}$ ($dPS_{24} < dPS_{25}$) in the memory cell transistor MT25. In addition, the PS diameter $dPS_t$ ($dPS_t > dPS_{25} > dPS_{24}$) in the memory cell transistor MTt (t is an integer from 26 to smaller than 47) is smaller than a PS diameter $dPS_{t+1}$ ($dPS_{t+1}>dPS_t>dPS_{25}>dPS_{24}$) in the memory cell transistor MTt+1. In addition, a PS diameter $dPS_{46}$ ($dPS_{46}>dPS_{t+1}>dPS_t>dPS_{25}>dPS_{24}$) in the memory cell transistor MT46 is smaller than a PS diameter $dPS_{47}$ ($dPS_{47}>dPS_{46}>dPS_{t+1}>dPS_t>dPS_{25}>dPS_{24}$) in the memory cell transistor MT47. That is, the PS diameter sequentially becomes larger from the memory cell transistor MT24 to the memory cell transistor MT47 ($dPS_u<dPS_v$ (u<v); and u and v are integers from 24 to 47).

Hereinafter, for simplification, the memory cell transistors MT0 and MT47 are shown to have the same PS diameter, the memory cell transistors MTs and MTt are shown to have the same PS diameter, and the memory cell transistors MT23 and MT24 are shown to have the same PS diameter. However, it is not necessary that embodiments are limited to the configuration.

The configuration of the memory cell array 111 is disclosed in, for example, U.S. patent application Ser. No. 12/407,403, filed Mar. 19, 2009, the title being "Three Dimensional Stacked Nonvolatile Semiconductor Memory". In addition, the configuration is also disclosed in U.S. patent application Ser. No. 12/406,524, filed Mar. 18, 2009, the title being "Three Dimensional Stacked Nonvolatile Semiconductor Memory"; in U.S. patent application Ser. No. 12/679,991, filed Mar. 25, 2010, the title being "Non-volatile Semiconductor Storage Device and Method of Manufacturing the Same"; and in U.S. patent application Ser. No. 12/532,030, filed Mar. 23, 2009, the title being "Semiconductor Memory and Method for Manufacturing Same". The entire patent applications are employed by references in the present disclosure.

Regarding Erasing Operation of Data of Seventh Embodiment

Figures 19A, 19B, 19C:
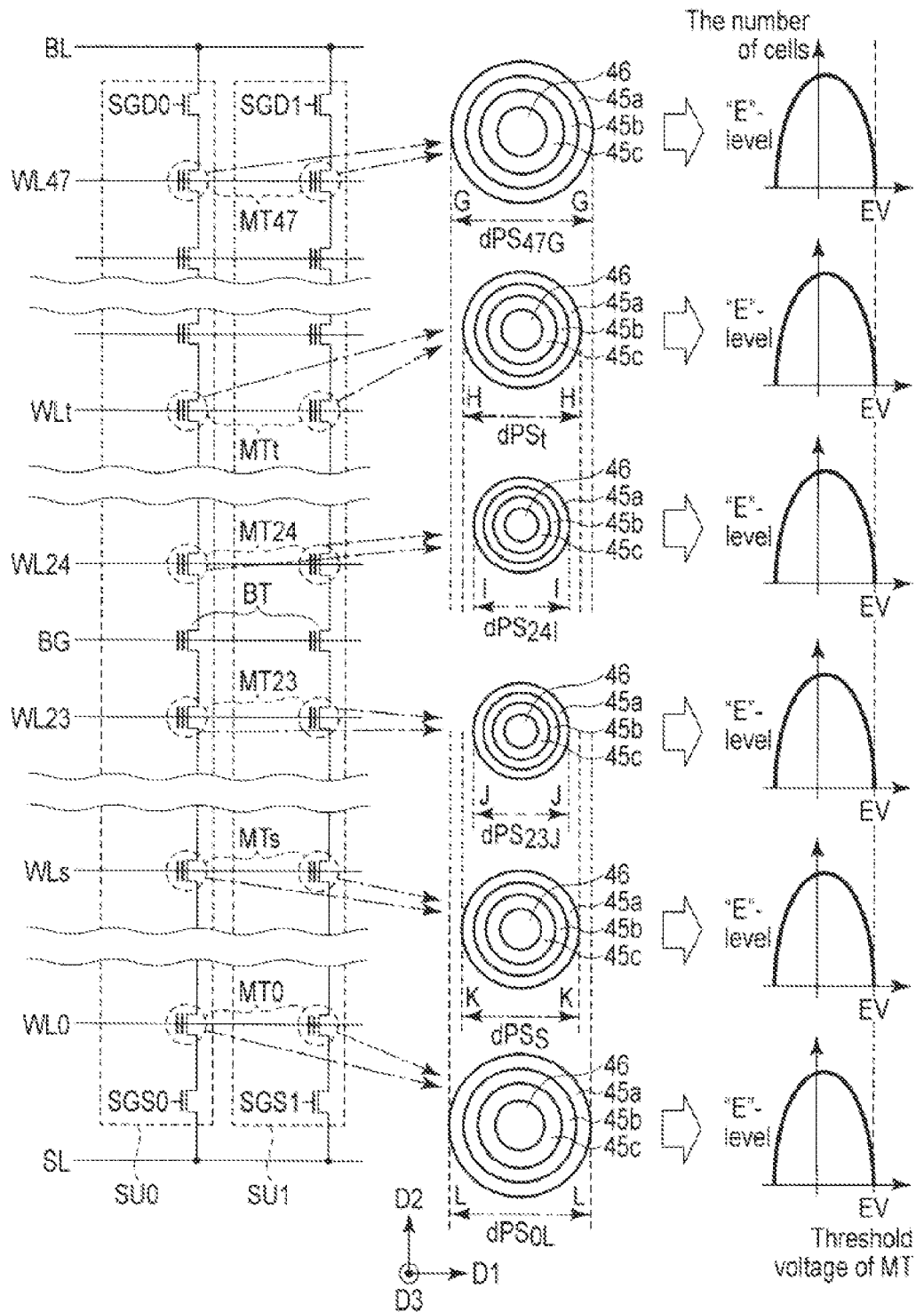
FIG. 19A is a circuit diagram of the memory cell array according to the seventh embodiment.
FIG. 19B is a cross-sectional view of memory cell transistors illustrated in FIG. 19A.
FIG. 19C is a graph illustrating a threshold value distribution of the memory cell transistors according to FIG. 19A and FIG. 19B.

Next, an erasing operation of the memory system 1 according to the seventh embodiment will be described with reference to FIGS. 18 to 20.

The basic erasing operation is the same as that of the above-described first embodiment. That is, the sequencer 121 according to the seventh embodiment makes the voltage VSWL larger as the PS diameter is smaller and makes the voltage VSWL smaller as the PS diameter is larger.

As described in FIG. 18, in the NAND strings 114 according to the seventh embodiment, the PS diameter becomes smaller from the word line WL0 to the word line WL23 and the PS diameter becomes larger from the word line WL24 to the word line WL47.

The sequencer 121 performs an operation the same as that in Step S101 according to the above-described first embodiment. A specific operation of the sequencer 121 according to the seventh embodiment will be described with reference to FIGS. 18 to 20.

As illustrated in FIG. 18 and FIG. 19A to FIG. 19C, the PS diameter differs in each of the memory cell transistors MT. As described above, the relationship between the PS diameters of the memory cell transistors MT0, MTs, and MT23 is $dPS_0>dPS_s>dPS_{23}$. The relationship between the PS diameters of the memory cell transistors MT24, MTt, and MT47 is $dPS_{24}<dPS_t<dPS_{47}$.

Figure 20:
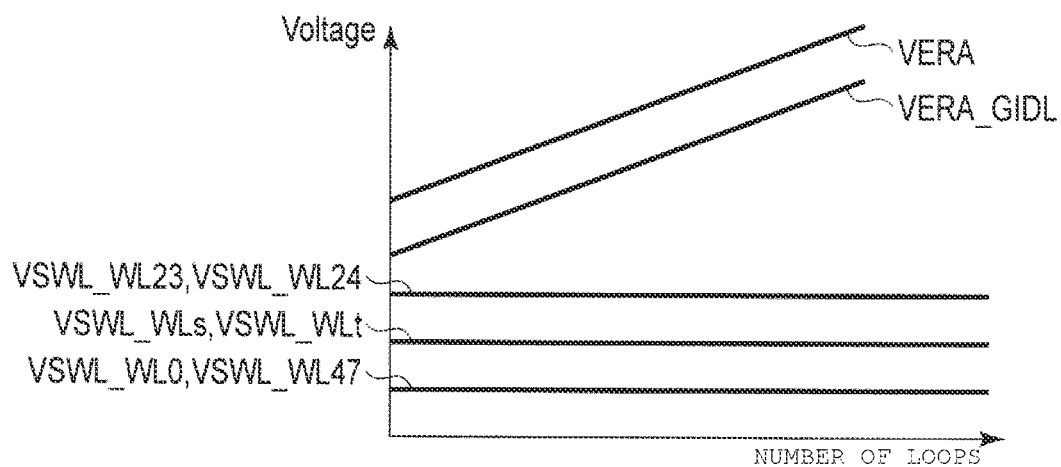
FIG. 20 is a graph illustrating a relationship between a voltage, which is applied to the memory cell transistors according to the seventh embodiment, during an erasing operation, and a loop frequency during the erasing operation.

As illustrated in FIG. 20, the sequencer 121 applies a voltage VSWL_WL0 to the word line WL0, applies a voltage VSWL_WLs (VSWL_WL0<VSWL_WLs) to the word line WLs, and applies a voltage VSWL_WL23 (VSWL_WL0<VSWL_WLs<VSWL_WL23) to the word line WL23. In addition, the sequencer 121 applies a voltage VSWL_WL24 to the word line WL24 (VSWL_WL23=VSWL_WL24), applies a voltage VSWL_WLt (VSWL_WL24>VSWL_WLt=VSWL_WLs) to the word line WLt, and applies a voltage VSWL_WL47 (VSWL_WL24>VSWL_WLt>VSWL_WL47=VSWL_WL0) to the word line WL47. The voltage VSWL is applied in accordance with the PS diameter of the memory cell transistor MT in this manner.

Effect of Seventh Embodiment

As described above, according to the memory system according to the seventh embodiment, similarly to the first embodiment, the sequencer 121 makes a voltage VSWL, which is applied to a word line WL of a memory cell transistor MT, larger as the PS diameter of the memory cell transistor MT is smaller. Moreover, the sequencer 121 makes a voltage VSWL, which is applied to a word line WL of a memory cell transistor MT, smaller as the PS diameter of the memory cell transistor MT is larger.

As a result, similarly to the first embodiment, it is possible to provide a high-quality memory system 1 that may suppress any deterioration or the like of the memory cell transistors MT.

Modification Example 1 of Seventh Embodiment

Figure 21:
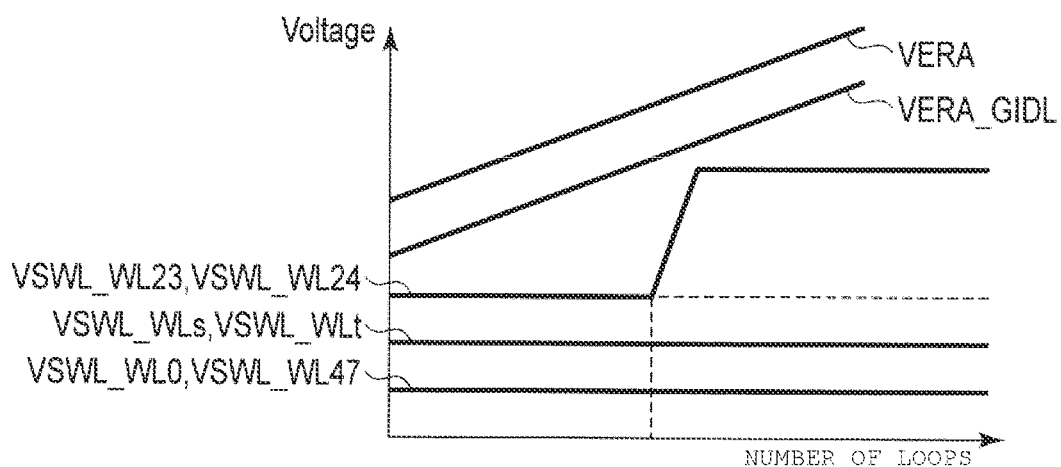
FIG. 21 is a graph illustrating a relationship between a voltage, which is applied to memory cell transistors according to Modification Example 1 of the seventh embodiment, during an erasing operation, and a loop frequency during the erasing operation.

It is also possible to apply the memory cell array 111 described in the seventh embodiment to the second embodiment. The basic erasing operation is the same as that described in the second embodiment. However, in Step S204, the sequencer 121 may increase the voltage VSWL of the word lines WL (for example, WL23, WL24, and the like) that belong to memory cell transistors MT (for example, MT23, MT24, and the like) having a small PS diameter as illustrated in FIG. 21, for example.

Modification Example 2 of Seventh Embodiment

Figure 22:
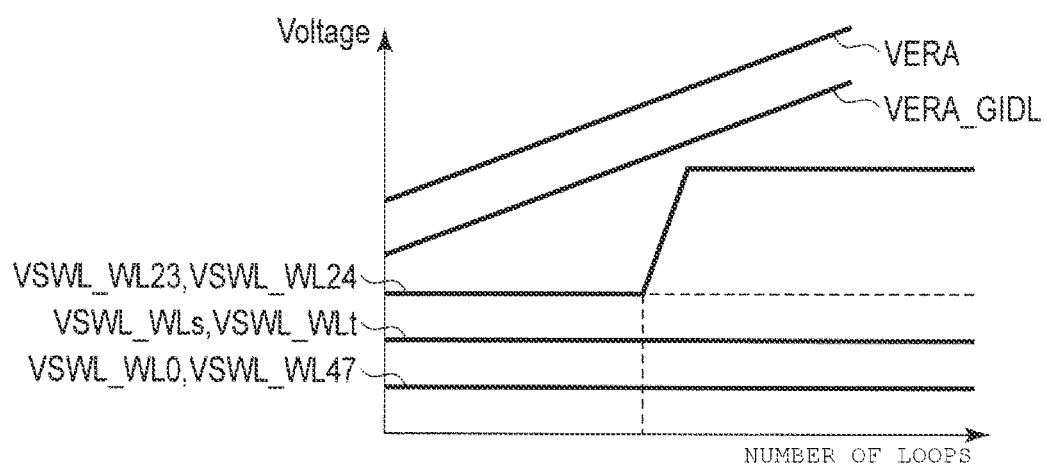
FIG. 22 is a graph illustrating a relationship between a voltage, which is applied to memory cell transistors according to Modification Example 2 of the seventh embodiment, during an erasing operation, and a loop frequency during the erasing operation.

In addition, it is also possible to apply the memory cell array 111 described in the seventh embodiment to the third embodiment. The basic erasing operation is the same as that described with reference to FIGS. 11A and 11B in the third embodiment. However, in Step S303 illustrated in FIGS. 11A and 11B, the sequencer 121 may increase the voltage VSWL of the word lines WL (for example, WL23, WL24, and the like) that belong to memory cell transistors MT (for example, MT23, MT24, and the like) having a small PS diameter as illustrated in FIG. 22, for example.

Modification Example 3 of Seventh Embodiment

Figure 23:
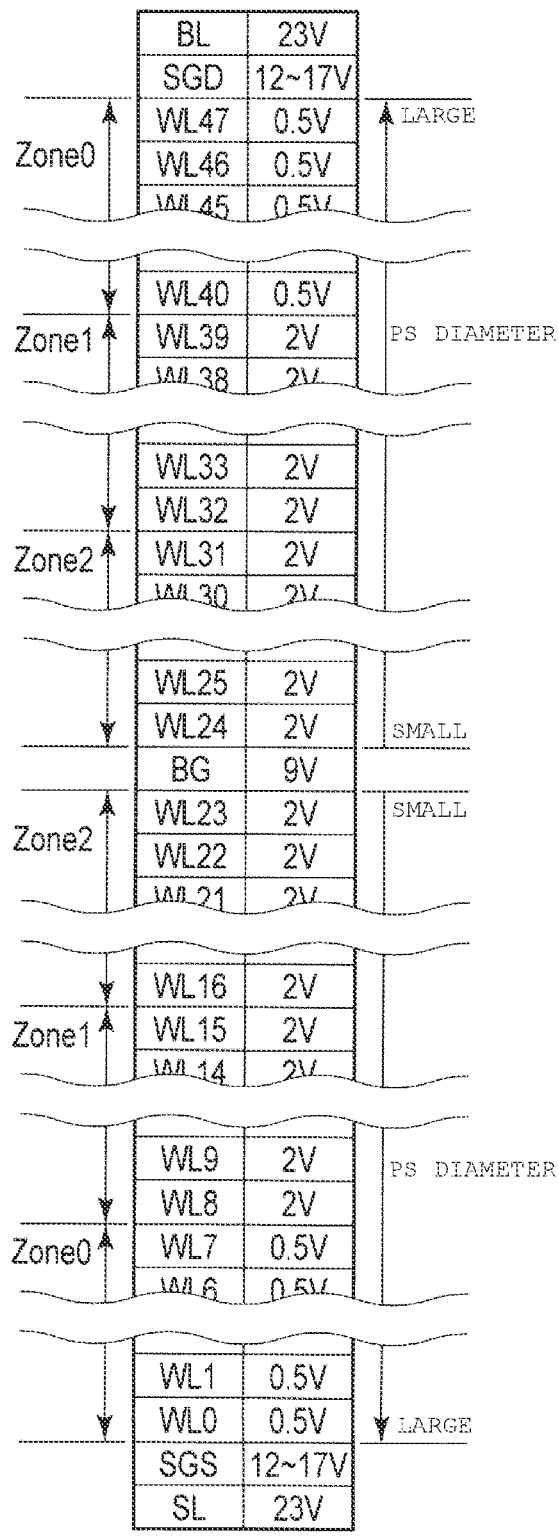
FIG. 23 is a view illustrating an example of an erasing operation of a memory system according to Modification Example 3 of the seventh embodiment.
Figure 24:
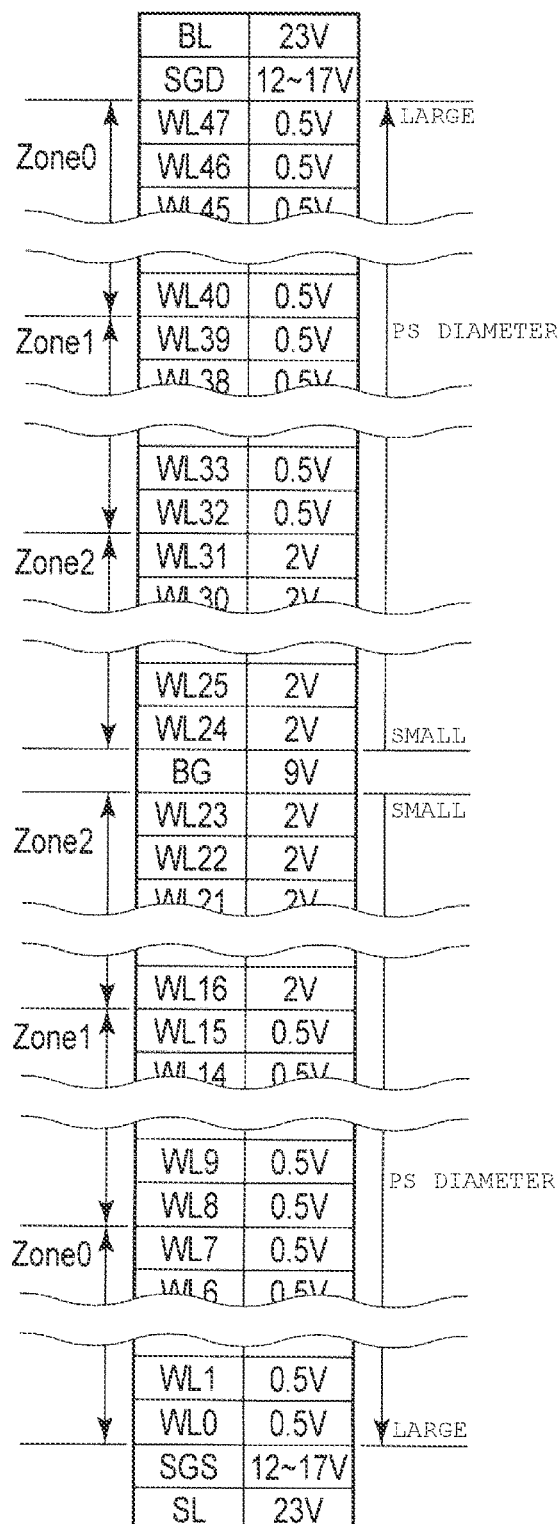
FIG. 24 is a view illustrating an example of the erasing operation of a memory system according to Modification Example 3 of the seventh embodiment.

In addition, it is also possible to apply the memory cell array 111 described in the seventh embodiment to the fourth embodiment. In this case, for example, The word lines WL0 to WL47 are divided into three areas (zones) as illustrated in FIGS. 23 and 24. In specific, the word lines WL0 to WL7 and the word lines WL40 to WL47 are set to a zone 0, the word lines WL8 to WL15 and the word lines WL32 to WL39 are set to a zone 1, the word lines WL16 to WL23 and the word lines WL24 to WL31 are set to a zone 2. According to the example, it is possible to more easily perform control than the fourth embodiment since the number of zones is less than the fourth embodiment.

Modification Example 4 of Seventh Embodiment

Figure 25:
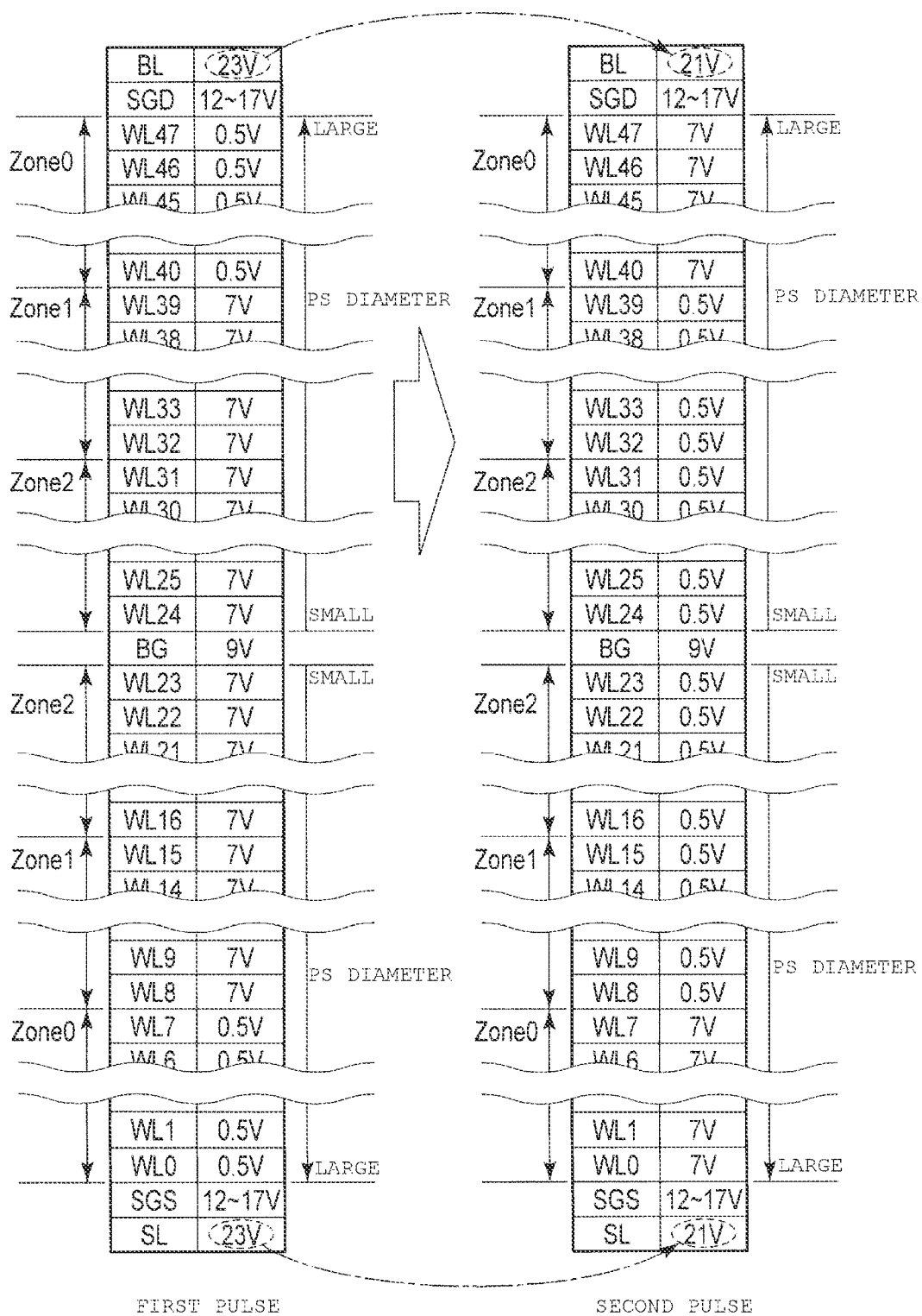
FIG. 25 is a view illustrating an example of an erasing operation of a memory system according to Modification Example 4 of the seventh embodiment.

In addition, it is also possible to apply the memory cell array 111 described in the seventh embodiment to the fifth embodiment. In this case, as described in FIGS. 23 and 24, it is possible to apply the memory cell array 111 according to the seventh embodiment to the fifth embodiment by defining the zones and the voltage VSWL as illustrated in FIG. 25.

Modification Example 5 of Seventh Embodiment

Figure 26:
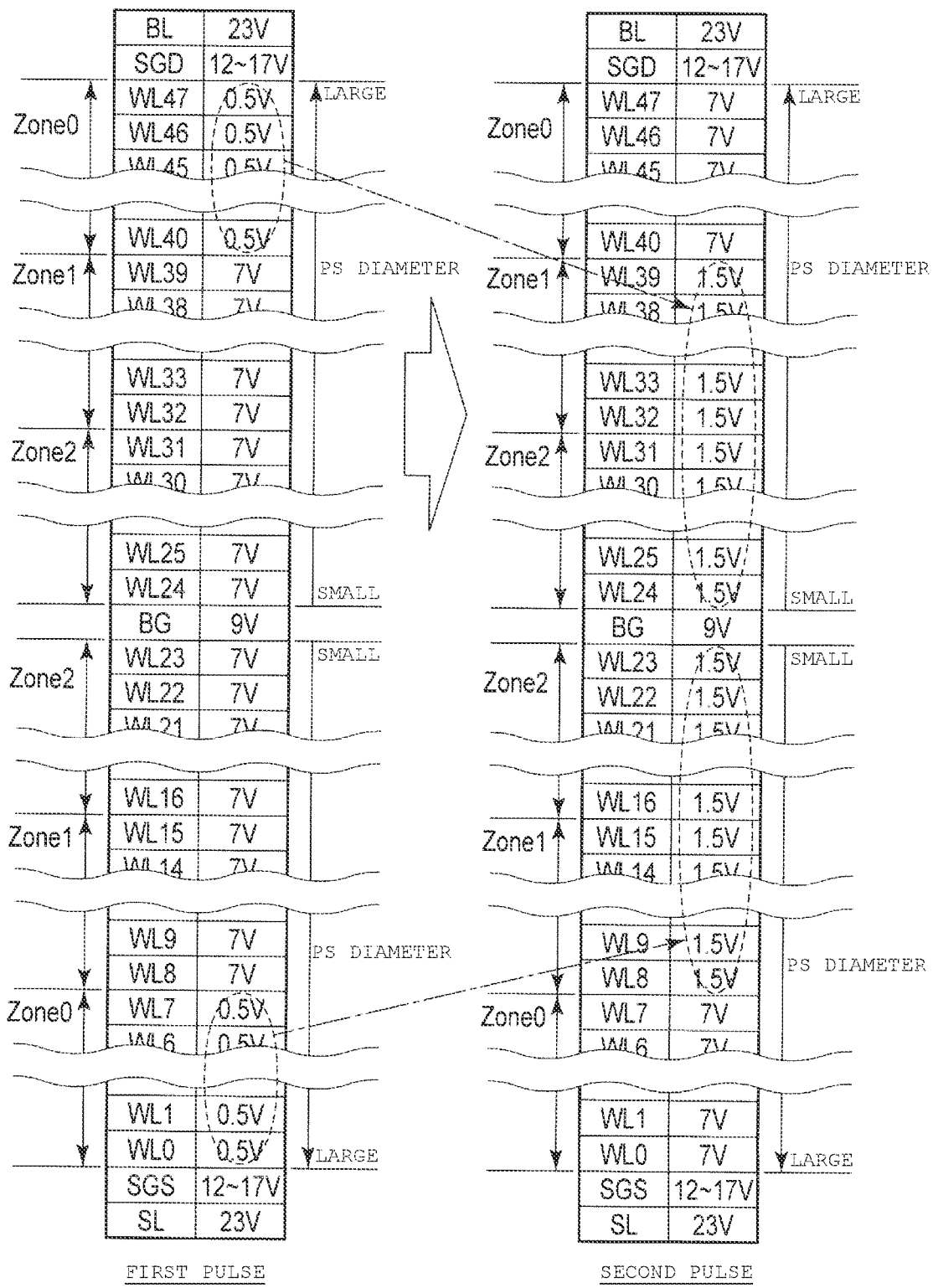
FIG. 26 is a view illustrating an example of an erasing operation of a memory system according to Modification Example 5 of the seventh embodiment.

In addition, it is also possible to apply the memory cell array 111 described in the seventh embodiment to the sixth embodiment. In this case, as described in FIGS. 23 and 24, it is possible to apply the memory cell array 111 according to the seventh embodiment to the sixth embodiment by defining the zones and the voltage VSWL as illustrated in FIG. 26.

Other Modification Examples

In the above-described embodiments, the sequencer 121 controls any excessive erasing in the memory cell transistor MT having a small PS diameter, by controlling the voltage which is applied to the word lines WL or the bit lines BL. However, it is also possible to obtain the effect the same as those of the above-described embodiments even by making the sequencer 121 shorten the pulse width of the voltage VSWL with respect to the memory cell transistor MT having a small PS diameter compared to the pulse width of the voltage VSWL with respect to the memory cell transistor MT having a large PS diameter, for example.

In addition, although the above-described first embodiment or the like is described assuming that the diameter (MH diameter) of the memory holes and the diameter (PS diameter) of the columnar structure become smaller as the extension direction of the memory holes becomes larger due to the process during the processing of the memory holes, embodiments are not limited thereto.

Furthermore, the configuration of the memory cell array 111 is not limited to the configuration described in the above-described embodiments. Embodiments may be widely applied to any storage device that varies in the PS diameter of the memory cell transistor MT. Accordingly, the above-described embodiments are not limited to the NAND flash memory 100, and may be overally applied to other storage devices. In addition, each of the embodiments may be either implemented alone or implemented in combination of plural embodiments which may be combined to each other.

The erasing operation is performed using GIDL in the above-described embodiments, but embodiments are not limited to the method. For example, there is a method (that is, a well-erasing method) of applying a voltage of about 20V to the well region 23 of FIG. 6 when erasing data of memory cells in the nonvolatile semiconductor memory of U.S. patent application Ser. No. 12/407,403, filed Mar. 19, 2009. In this case, for example, the voltage 20 V to 23 V is applied to the well region 23, the source area 24 and the bit line are made to be floating, and the voltages of about 15 V and 10 V are respectively applied to the gates of the select gate transistors SGS and SGD. The voltage applied to the gates of the select gate transistors SGD is set to be lower than the voltage applied to the gates of the select gate transistors SGS. It is possible to apply the well-erasing method in each of the embodiments.

In each of the embodiments, (1) in the read operation,

The voltage which is applied to the selected word line for the read operation of the "A" level is in the range between 0 V to 0.55 V, for example. However, the voltage is not limited thereto and may be in any one of the ranges between 0.1 V to 0.24 V, 0.21 V to 0.31 V, 0.31 V to 0.4 V, 0.4 V to 0.5 V, and 0.5 V to 0.55 V.

The voltage which is applied to the selected word line for the read operation of the "B" level is in the range between 1.5 V to 2.3 V, for example. However, the voltage is not limited thereto and may be in any one of the ranges between 1.65 V to 1.8 V, 1.8 V to 1.95 V, 1.95 V to 2.1 V, and 2.1 V to 2.3 V.

The voltage which is applied to the selected word line for the read operation of the "C" level is in the range between 3.0 V to 4.0 V, for example. However, the voltage is not limited thereto and may be in any one of the ranges between 3.0 V to 3.2 V, 3.2 V to 3.4 V, 3.4 V to 3.5 V, 3.5 V to 3.6 V, and 3.6 V to 4.0 V.

The duration (tR) of the read operation may be in the ranges between 25 μs to 38 μs, 38 μs to 70 μs, and 70 μs to 80 μs.

(2) The write operation includes the program operation and the verification operation as described above. In the write operation, the voltage which is first applied to the selected word line during the program operation is in the range between 13.7 V to 14.3 V, for example. However, the voltage is not limited thereto and may be in any one of the ranges between 13.7 V to 14.0 V, and 14.0 V to 14.6 V, for example.

Moreover, a voltage, which is first applied to the selected word line when writing an odd-numbered word line, may be changed to a voltage, which is first applied to the selected word line when writing an even-numbered word line.

When the program operation is set as an incremental step pulse program (ISPP) method, an example of the step-up voltage includes 0.5 V.

The voltage applied to the non-select word line may be in the range between 6.0 V to 7.3 V. The voltage is not limited thereto. For example, the voltage may be in the range between 7.3 V to 8.4 V and may be 6.0 V or less.

A pass voltage to be applied may be changed according to whether the non-select word line is the odd-numbered word line or the even-numbered word line.

The duration (tProg) of the write operation may be in the ranges between 1,700 μs to 1,800 μs, 1,800 μs to 1,900 μs, and 1,900 μs to 2,000 μs.

(3) In the erasing operation, the voltage first applied to the well which is formed on the semiconductor substrate and above which the memory cells are disposed is in the range between 12 V to 13.6 V, for example. However, the voltage is not limited thereto, and may be in the ranges between 13.6 V to 14.8 V, 14.8 V to 19.0 V, 19.0 V to 19.8 V, and 19.8 V to 21 V, for example.

The duration (tErase) of the erasing operation may be in the ranges between 3,000 μs to 4,000 μs, 4,000 μs to 5,000 μs, and 4,000 μs to 9,000 μs.

(4) The structure of the memory cell

The structure of the memory cell includes a charge storage layer which is disposed on the semiconductor substrate (silicon substrate) through a tunnel insulating film having a thickness in the range of 4 nm to 10 nm. The charge storage layer may be made to have a stacked structure with an insulating film, such as SiN or SiON having a thickness in the range of 2 nm to 3 nm, and with polysilicon having a thickness in the range of 3 nm to 8 nm. In addition, a metal such as Ru may be added to the polysilicon. The charge storage layer includes an insulating film thereon. The insulating film includes a silicon oxide film which has a thickness in the range of 4 nm to 10 nm interposed between a lower-layer high-k film having a thickness in the range of 3 nm to 10 nm and an upper-layer high-k film having a thickness in the range of 3 nm to 10 nm. An example of the high-k film includes HfO. In addition, it is possible to make the thickness of the silicon oxide film thicker than the thickness of the high-k film. A control electrode having a thickness in the range of 30 nm to 70 nm is formed on the insulating film through a material that is for adjusting work function and has a thickness in the range of 3 nm to 10 nm. Here, the material for adjusting work function is a metal oxide film such as TaO or a metal nitride film such as TaN. It is possible to use W or the like for the control electrode.

In addition, it is possible to form an air gap between the memory cells.

In addition, in the above-described embodiments, a specific configuration of each of the elements, such as a substrate, an electrode film, an insulating film, a stacked structure, a storage layer, a charge storage layer, a semiconductor pillar, a word line, a bit line, a source line, a wiring, a memory cell transistor, a select gate transistor, and the like, that forms the nonvolatile semiconductor memory device, is included in the scope of each of the above-described embodiments when those skilled in the art may also implement embodiments by appropriately selecting the configuration from the well-known scope and may obtain the same effect.

In addition, a combination of any two or more elements of the above-described embodiments within a scope, in which embodiments may be technically implemented, is also included in the scope of the embodiments as long as the combination includes the gist of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a source line;
   a bit line;
   a memory cell array including a memory string electrically connected between the bit line and the source line, the memory string including a first select transistor, a second select transistor, and a plurality of memory cell transistors electrically connected in series between the first select transistor and the second select transistor, the memory cell transistors including
      a first memory cell transistor,
      a second memory cell transistor, wherein the first memory cell transistor is between the first select transistor and the second memory cell transistor,
      a third memory cell transistor, and
      a fourth memory cell transistor, wherein the fourth memory cell transistor is between the third memory cell transistor and the second select transistor;
   a plurality of word lines electrically connected to gates of the memory cell transistors, respectively, the word lines including
      a first word line electrically connected to the gate of the first memory cell transistor,
      a second word line electrically connected to the gate of the second memory cell transistor,
      a third word line electrically connected to the gate of the third memory cell transistor, and
      a fourth word line electrically connected to the gate of the fourth memory cell transistor;
   a sequencer configured to perform an erase operation on the memory cell transistors, the erase operation including an erase voltage apply operation and an erase verify operation, the erase voltage apply operation using a Gate-Induced-Drain-Leakage (GIDL) current,
   wherein, during the erase operation,
      a first voltage is applied to the first word line,
      a second voltage different from the first voltage is applied to the second word line,
      a third voltage is applied to the third word line, and
      a fourth voltage different from the third voltage is applied to the fourth word line.

2. The semiconductor memory device according to claim 1, wherein
   the first voltage is lower than the second voltage,
   the first memory cell transistor is above the second memory cell transistor,
   the first select transistor is above the first memory cell transistor, and
   the bit line is above the first select transistor.

3. The semiconductor memory device according to claim 2, wherein
   the fourth voltage is higher than the third voltage,
   the fourth memory cell transistor is below the third memory cell transistor,
   the second select transistor is below the fourth memory cell transistor, and
   the source line is below the second select transistor.

4. The semiconductor memory device according to claim 3, wherein
   the memory cell transistors further include
      a fifth memory cell transistor, wherein the fifth memory cell transistor is between the first memory cell transistor and the second memory cell transistor,
   the word lines further include
      a fifth word line electrically connected to the gate of the fifth memory cell transistor, and
   during the erase operation,
      a fifth voltage different from the first voltage and the second voltage is applied to the fifth word line,
      the first voltage is lower than the fifth voltage, and
      the fifth voltage is lower than the second voltage.

5. The semiconductor memory device according to claim 4, wherein
   the memory cell transistors further include
      a sixth memory cell transistor, wherein the sixth memory cell transistor is between the third memory cell transistor and the fourth memory cell transistor;
   the word lines further include
      a sixth word line electrically connected to the gate of the sixth memory cell transistor,
   during the erase operation,
      a sixth voltage different from the third voltage and the fourth voltage is applied to the sixth word line,
      the third voltage is lower than the sixth voltage, and
      the fourth voltage is higher than the sixth voltage.

6. The semiconductor memory device according to claim 2, wherein
   the fourth voltage is lower than the third voltage,
   the fourth memory cell transistor is above the third memory cell transistor, the second select transistor is above the third memory cell transistor, and the source line is above the second select transistor.

7. The semiconductor memory device according to claim 6, wherein the memory cell transistors further includes
a fifth memory cell transistor, wherein the fifth memory cell transistor is between the first memory cell transistor and the second memory cell transistor, the word lines further includes
a fifth word line electrically connected to the gate of the fifth memory cell transistor, and during the erase operation,
a fifth voltage different from the first voltage and the second voltage is applied to the fifth word line, the first voltage is lower than the fifth voltage, and
the fifth voltage is lower than the second voltage.

8. The semiconductor memory device according to claim 7, wherein the memory cell transistors further includes
a sixth memory cell transistor, wherein the sixth memory cell transistor is between the third memory cell transistor and the fourth memory cell transistor;

the word lines further includes
a sixth word line electrically connected to the gate of the sixth memory cell transistor, during the erase operation,
a sixth voltage different from the third voltage and the fourth voltage is applied to the sixth word line, the third voltage is higher than the sixth voltage, and
the sixth voltage is higher than the fourth voltage.

9. The semiconductor memory device according to claim 1, wherein the semiconductor memory device is a NAND flash memory.

10. The semiconductor memory device according to claim 1, wherein each of the memory cell transistors is configured to store multi-bit data.

11. The semiconductor memory device according to claim 1, further comprising:

a first semiconductor pillar extending through a first part of the word lines, the first part of the word lines including the first word line and the second word line;

a first charge storage layer between the first semiconductor pillar and the first part of the word lines;

a second semiconductor pillar extending through a second part of the word lines, the second part of the word lines including the third word line and the fourth word line;

a second charge storage layer between the second semiconductor pillar and the second part of the word lines.

12. The semiconductor memory device according to claim 11, wherein one part of the first semiconductor pillar and one part of the first charge storage layer that are surrounded by the first word line function as the first memory cell transistor, another part of the first semiconductor pillar and another part of the first charge storage layer that are surrounded by the second word line function as the second memory cell transistor, one part of the second semiconductor pillar and one part of the second charge storage layer that are surrounded by the third word line function as the third memory cell transistor, and another part of the second semiconductor pillar and another part of the second charge storage layer that are surrounded by the fourth word line function as the fourth memory cell transistor.

13. The semiconductor memory device according to claim 11, wherein each of the word lines extends in a first direction and a second direction crossing the first direction, and each of the first semiconductor pillar and the second semiconductor pillar extends in a third direction crossing the first and second directions.

14. The semiconductor memory device according to claim 13, wherein when viewed along the third direction, each of the first semiconductor pillar and the second semiconductor pillar has a circular shape, and each of the first charge storage layer and the second charge storage layer has a donut shape.

15. The semiconductor memory device according to claim 1, wherein the erase operation includes the erase voltage apply operation carried out multiple times, in one of the erase voltage apply operations during which a first erase voltage is applied,
the first voltage is applied to the first word line,
the second voltage is applied to the second word line,
the third voltage is applied to the third word line, and
the fourth voltage is applied to the fourth word line, and in another one of the erase voltage apply operations during which a second erase voltage higher than the first erase voltage is applied,
the first voltage is applied to the first word line,
a seventh voltage higher than the second voltage is applied to the second word line,
the third voltage is applied to the third word line, and
an eighth voltage higher than the fourth voltage is applied to the fourth word line.

16. The semiconductor memory device according to claim 1, wherein the erase operation includes the erase voltage apply operation carried out multiple times, in one of the erase voltage apply operations during which a first erase voltage is applied,
the first voltage is applied to the first word line,
the second voltage is applied to the second word line,
the third voltage is applied to the third word line, and
the fourth voltage is applied to the fourth word line, and in another one of the erase voltage apply operations during which a second erase voltage higher than the first erase voltage is applied,
the first voltage is applied to the first word line,
a seventh voltage higher than the second voltage is applied to the second word line,
an eighth voltage higher than the third voltage is applied to the third word line, and
the fourth voltage is applied to the fourth word line.

* * * * *